(12) United States Patent
Yamada

(10) Patent No.: US 7,054,217 B2
(45) Date of Patent: May 30, 2006

(54) SEMICONDUCTOR MEMORY DEVICE

(75) Inventor: Kouichi Yamada, Gifu (JP)

(73) Assignee: Sanyo Electric Co. Ltd., Osaka (JP)

( * ) Notice: Subject to any disclaimer, the term of this patent is extended or adjusted under 35 U.S.C. 154(b) by 0 days.

(21) Appl. No.: 10/937,335

(22) Filed: Sep. 10, 2004

(65) Prior Publication Data
US 2005/0058003 A1    Mar. 17, 2005

(30) Foreign Application Priority Data

| Sep. 12, 2003 | (JP) | ............................. 2003-320510 |
| Sep. 16, 2003 | (JP) | ............................. 2003-322473 |

(51) Int. Cl.
*G11C 8/00* (2006.01)
*G11C 11/00* (2006.01)

(52) U.S. Cl. ........................... 365/230.05; 365/230.06; 365/154; 365/156

(58) Field of Classification Search ................ 365/154, 365/156, 189.05, 189.08, 230.03, 230.05, 365/230.08

See application file for complete search history.

(56) References Cited

U.S. PATENT DOCUMENTS

| 5,005,158 | A | * | 4/1991 | McClure et al. ....... 365/230.05 |
| 5,541,874 | A | * | 7/1996 | O'Connor .................... 365/156 |
| 6,104,658 | A | * | 8/2000 | Lu ......................... 365/230.05 |
| 6,111,780 | A | * | 8/2000 | Bertin ......................... 365/156 |
| 6,128,244 | A | * | 10/2000 | Thompson et al. .... 365/230.03 |
| 6,335,873 | B1 | * | 1/2002 | Kawaguchi et al. ... 365/230.03 |
| 6,594,818 | B1 | * | 7/2003 | Kim et al. ................... 365/154 |
| 6,765,817 | B1 | * | 7/2004 | Takemura ................... 365/154 |
| 6,904,502 | B1 | * | 6/2005 | Quach et al. .......... 365/230.05 |

FOREIGN PATENT DOCUMENTS

| JP | 05-109279 | 4/1993 |
| JP | 08-212784 | 8/1996 |
| JP | 09-017177 | 1/1997 |

* cited by examiner

Primary Examiner—Trong Phan
(74) Attorney, Agent, or Firm—Arent Fox, PLLC.

(57) ABSTRACT

A semiconductor memory device capable of improving the operating speed while suppressing size increase is provided. This semiconductor device comprises a plurality of word lines and a plurality of bit lines arranged to intersect with each other, a single-port SRAM cell, connected to the bit lines and the word lines, having a single port for inputting/outputting data, a first row decoder and a second row decoder connected to the word lines for selecting a row address and a first column decoder and a second column decoder connected to the bit lines for selecting a column address, while each word line is divided into a plurality of local word lines.

23 Claims, 10 Drawing Sheets

SEMICONDUCTOR MEMORY DEVICE

BACKGROUND OF THE INVENTION

1. Field of the Invention

The present invention relates to a semiconductor memory device, and more particularly, it relates to a semiconductor memory device including SRAM (static random access memory) cells.

2. Description of the Background Art

A semiconductor memory device employing a single-port SRAM cell having a single port for inputting/outputting data is known in general. FIG. 15 is a circuit diagram showing an exemplary conventional single-port SRAM cell 206. Referring to FIG. 15, the exemplary conventional single-port SRAM cell 206 is constituted of six transistors in total, i.e., four n-channel transistors NT201, NT202, NT206 and NT207 and two p-channel transistors PT201 and PT202.

In operation, a semiconductor memory device employing the exemplary conventional single-port SRAM cell 206 shown in FIG. 15 holds the potential of a word line WL at a low level in an initial state. Thus, the semiconductor memory device holds the potentials of the gates of the n-channel transistors NT201 and NT202 at low levels, thereby holding the n-channel transistors NT201 and NT202 in OFF states. When the potentials of nodes ND201 and ND202 are at high and low levels respectively in this state, the potentials of the gates of the n-channel transistor NT207 and the p-channel transistor PT202 go high, thereby turning the n-channel transistor NT207 and the p-channel transistor PT202 on and off respectively. At this time, the n-channel transistor NT202 is in the OFF state, and hence a ground potential is supplied through the n-channel transistor NT207 for holding the potential of the node ND202 at the low level.

The potentials of the gates of the n-channel transistor NT206 and the p-channel transistor PT201 go low due to the potential of the node ND202 held at the low level, thereby turning the n-channel transistor NT206 and the p-channel transistor PT201 off and on respectively. At this time, the n-channel transistor NT201 is in the OFF state, and hence a positive voltage Vcc is supplied through the p-channel transistor PT201 for holding the node ND201 at the high level.

In the single-port SRAM cell 206, as hereinabove described, it is possible to hold the potentials of the nodes ND201 and ND202 by holding the n-channel transistors NT201 and NT202 in the OFF states. When a high-level signal for selecting a row address is supplied to the word line WL, the potentials of the gates of the n-channel transistors NT201 and NT202 rise to high levels, thereby turning on the n-channel transistors NT201 and NT202. Thus, data can be written in/read from the single-port SRAM cell 206 through a pair of bit lines BL and /BL.

When the semiconductor memory device employing the exemplary conventional single-port SRAM cell 206 shown in FIG. 15 selects a prescribed word line WL and supplies a high-level signal thereto, however, the n-channel transistors NT201 and NT202 of all single-port SRAM cells 206 connected to this word line WL are turned on. Thus, all pairs of bit lines BL and /BL connected to all single-port SRAM cells 206 connected to the word line WL supplied with the high-level signal are activated. Therefore, a prescribed SRAM cell 206 cannot be accessed through a second system while the same is accessed through a first system. Thus, access from the second system enters the wait state during the access from the first system, and hence it is disadvantageously difficult to improve the operating speed in the semiconductor memory device employing the exemplary conventional single-port SRAM cell 206 shown in FIG. 15.

In order to solve the problem of the semiconductor memory device employing the exemplary conventional single-port SRAM cell 206 shown in FIG. 15, there are proposed various types of semiconductor memory devices improving operating speeds by employing dual-port SRAM cells allowing simultaneous data writing and data reading from two different systems. For example, Japanese Patent Laying-Open No. 5-109279 (1993) proposes such a semiconductor memory device.

FIG. 16 is a circuit diagram showing a conventional dual-port SRAM cell 209 disclosed in Japanese Patent Laying-Open No. 5-109279. Referring to FIG. 16, the conventional dual-port SRAM cell 209 is constituted of eight transistors in total, i.e., six n-channel transistors NT203, NT204 and NT208 to NT211 and two p-channel transistors PT203 and PT204. This dual-port SRAM cell 209 comprises two ports for inputting/outputting data, dissimilarly to the exemplary conventional single-port SRAM cell 206 shown in FIG. 15. The two ports are constituted of the n-channel transistors NT203 and NT204 and the n-channel transistors NT210 and NT211 respectively. A pair of bit lines BL1 and /BL1 and a word line WL1 are connected to the port constituted of the n-channel transistors NT203 and NT204. Further, another pair of bit lines BL2 and /BL2 and another word line WL2 are connected to the port constituted of the n-channel transistors NT210 and NT211. The n-channel transistors NT208 and NT209 and the p-channel transistors PT203 and PT204 are similar in circuit structure to the n-channel transistors NT206 and NT207 and the p-channel transistors PT201 and PT202 shown in FIG. 15 respectively.

In operation of a semiconductor memory device employing the conventional dual-port SRAM cell 209 shown in FIG. 16, the n-channel transistors NT208 and NT209 and the p-channel transistors PT203 and PT204 hold the potentials of nodes ND203 and ND204 similarly to those in the semiconductor memory device employing the single-port SRAM cell 206 shown in FIG. 15. When a high-level signal for selecting a row address is supplied to the word line WL1, the potentials of the gates of the n-channel transistors NT203 and NT204 rise to high levels, thereby turning on the n-channel transistors NT203 and NT204. Thus, data can be written in/read from the dual-port SRAM cell 209 through the pair of bit lines BL1 and /BL1. When the high-level signal for selecting the row address is supplied to the word line WL2, on the other hand, the potentials of the gates of the n-channel transistors NT210 and NT211 rise to high levels, thereby turning on the n-channel transistors NT210 and NT211. Thus, data can be written in/read from the dual-port SRAM cell 209 through the pair of bit lines BL2 and /BL2. In this case, the pair of bit lines BL2 and /BL2 are not activated when the high-level signal is supplied to the word line WL1 while the pair of bit lines BL1 and /BL1 are not activated when the high-level signal is supplied to the word line WL2, whereby a second dual-port SRAM cell 209 can be accessed through a second port while a first dual-port SRAM cell 209 is accessed through a first port. Thus, the semiconductor memory device employing the dual-port SRAM cell 209 can simultaneously write/read data in/from two different dual-port SRAM cells 209 from two different systems of the pairs of bit lines BL1 and /BL1 and BL2 and /BL2, whereby the semiconductor memory device can be simultaneously accessed through two different systems. Thus, access from a second system can be inhibited from entering the wait state during access from a first system, whereby the operating speed of the semiconductor memory device can be improved.

However, the conventional dual-port SRAM cell 209 shown in FIG. 16 must be provided with the two pairs of bit lines BL1, /BL1, BL2 and /BL2 and the two word lines WL1 and WL2 in correspondence to the two ports provided on the dual-port SRAM cell 209, and hence the numbers of the bit lines BL1, /BL1, BL2 and /BL2 and the word lines WL1 and WL2 are disadvantageously doubled as compared with the single-port SRAM cell 206. Thus, the space for arranging the bit lines BL1, /BL1, BL2 and /BL2 and the word lines WL1 and WL2 is disadvantageously increased. In the dual-port SRAM cell 209 constituted of the eight transistors, i.e., the n-channel transistors NT203, NT204 and NT208 to NT211 and the p-channel transistors PT203 and PT204, further, the number of the transistors is disadvantageously increased as compared with the single-port SRAM cell 206 constituted of the six transistors. Thus, the cell area of the dual-port SRAM cell 209 is disadvantageously increased as compared with the single-port SRAM cell 206 due to the increased number of the transistors. Therefore, the space for arranging the bit lines BL1, /BL1, BL2 and /BL2 and the word lines WL1 and WL2 as well as the cell area are increased in the conventional dual-port SRAM cell 209 shown in FIG. 16, to disadvantageously increase the size of the semiconductor memory device. Thus, the size of the semiconductor memory device constituted of only dual-port SRAM cells must disadvantageously be increased in order to improve the operating speed thereof.

SUMMARY OF THE INVENTION

The present invention has been proposed in order to solve the aforementioned problems, and an object of the present invention is to provide a semiconductor memory device capable of improving the operating speed while suppressing size increase.

In order to attain the aforementioned object, a semiconductor memory device according to a first aspect of the present invention comprises a plurality of word lines and a plurality of bit lines arranged to intersect with each other, a memory cell array including a plurality of single-port SRAM cells, each having a single port, connected to the word lines and the bit lines, an auxiliary word line arranged on a prescribed position of the memory cell array and an auxiliary memory, arranged along the auxiliary word line, including a column of dual-port SRAM cells having at least first ports connected to the bit lines. In this case, the semiconductor memory device is preferably provided with only a single auxiliary word line.

The aforementioned semiconductor memory device according to the first aspect, provided with the auxiliary memory, including the column of dual-port SRAM cells, arranged along the auxiliary word line on the prescribed position of the SRAM cell array including the plurality of single-port SRAM cells and the bit lines connected to the first ports of the dual-port SRAM cells, can transfer data of the single-port SRAM cells to the dual-port SRAM cells of the auxiliary memory through the bit lines and the first ports connected to the bit lines. Further, the semiconductor memory device can read the data transferred to the dual-port SRAM cells from ports of the dual-opt SRAM cells other than the first ports connected to the bit lines. Therefore, the semiconductor memory device can read data from the dual-port SRAM cells of the auxiliary memory while writing/reading data in/from the single-port SRAM cells through the bit lines at the same time. Thus, data can be read from the semiconductor memory device through a second system while making access to the semiconductor memory device through a first system, dissimilarly to a semiconductor memory device constituted of only single-port SRAM cells. Therefore, data reading through the second system can be inhibited from entering the wait state during the access through the first system. Consequently, the operating speed of the semiconductor memory device can be improved. Further, only the column of dual-port SRAM cells may be provided for improving the operating speed of the semiconductor memory device, whereby the numbers of the bit lines and the word lines as well as transistors constituting the semiconductor memory device can be reduced as compared the semiconductor memory device constituted of only dual-port SRAM cells. Thus, the area of the memory cell array can be reduced as compared with the semiconductor memory device constituted of only dual-port SRAM cells, due to the reduced numbers of the bit lines, the word lines and the transistors. Consequently, the semiconductor memory device can be inhibited from size increase as compared with the semiconductor memory device constituted of only dual-port SRAM cells. Further, the semiconductor memory device is so constituted of only the SRAM cells having smaller power consumption than DRAM cells that power consumption of the semiconductor memory device can be reduced as compared with a semiconductor memory device constituted of DRAM cells.

In the aforementioned semiconductor memory device according to the first aspect, the dual-port SRAM cells preferably further include second ports not connected to the bit lines, and the second ports are preferably dedicated to data reading from the dual-port SRAM cells. According to this structure, no bit lines may be provided for writing data in the second ports of the dual-port SRAM cells, whereby no control may be made for precharging the bit lines or the like. Further, data can be read from a prescribed dual-port SRAM cell without switching a write operation to a read operation, whereby the data can be easily read from the prescribed dual-port SRAM cell.

In this case, the semiconductor memory device preferably further comprises an auxiliary column decoder supplying a column address selection signal to the dual-port SRAM cells, and the second ports of the dual-port SRAM cells preferably output signals by ANDing the column address selection signal supplied from the auxiliary column decoder and data signals output from the dual-port SRAM cells. According to this structure, it is possible to select a prescribed dual-port SRAM cell for outputting a signal by inputting the column address selection signal in the second port of this dual-port SRAM cell from the auxiliary column decoder, whereby the semiconductor memory device can easily select the prescribed dual-port SRAM cell for reading data.

In the aforementioned semiconductor memory device according to the first aspect, each dual-port SRAM cell preferably includes two inverter circuits, the two inverter circuits are preferably connected to a ground potential through an n-channel transistor, and a first transfer signal and a second transfer signal obtained by inverting the first transfer signal are preferably input in the auxiliary word line and the gate of the n-channel transistor respectively. According to this structure, an inactive second transfer signal is input in the gate of the n-channel transistor when an active first transfer signal is input in the auxiliary word line, whereby the dual-port SRAM cells connected to the auxiliary word line are activated and the n-channel transistor can be turned off. Thus, connection between the two inverter circuits of each dual-port SRAM cell and the ground potential is cut off when the dual-port SRAM cell is activated, whereby the side of an input/output node of the dual-port SRAM cell outputting a low level enters a floating state when the dual-port SRAM cell is activated. Therefore, new data can be easily written in the dual-port SRAM cell. When an inactive first transfer signal is input in the auxiliary word line, on the other hand, an active second transfer signal is input in the gate of the n-channel transistor, whereby the dual-port SRAM cells connected to the auxiliary word line are inactivated and the n-channel transistor can be turned on. Thus, data input from the bit lines into the dual-port SRAM cells is cut off while the two inverter circuits of each dual-port SRAM cell and the ground potential are connected with each other, whereby the data written in the dual-port SRAM cells can be held.

The aforementioned semiconductor memory device according to the first aspect preferably activates the auxiliary word line connected with the dual-port SRAM cells after activating the word lines connected with the single-port SRAM cells when transferring data from the single-port SRAM cells to the dual-port SRAM cells. According to this structure, the semiconductor memory device, capable of activating the dual-port SRAM cells after activating the single-port SRAM cells, can activate the dual-port SRAM cells after the single-port SRAM cells output data to the bit lines. Also when the data output from the single-port SRAM cells collide with data recorded in the dual-port SRAM cells, therefore, the former take precedence over the latter. Thus, the semiconductor memory device can inhibit the data output from the single-port SRAM cells from destruction resulting from collision with the data of the dual-port SRAM cells.

In this case, the semiconductor memory device preferably inputs a row address selection signal and a first transfer signal in the word lines and the auxiliary word line respectively, for inputting the row address selection signal for activating the word lines in the word lines and thereafter inputting the first transfer signal for activating the auxiliary word line in the auxiliary word line. According to this structure, the semiconductor memory device, capable of easily activating the auxiliary word line after activating the word lines, can easily activate the dual-port SRAM cells after activating the single-port SRAM cells.

In this case, further, the semiconductor memory preferably further comprises a row decoder supplying the row address selection signal to the word lines and a transfer signal generation circuit supplying the first transfer signal to the auxiliary word line, while the row decoder preferably includes a prescribed number of inverter circuits, the transfer signal generation circuit preferably includes inverter circuits in a number larger than the prescribed number, the row address selection signal is preferably input in the word lines through the prescribed number of inverter circuits of the row decoder, and the first transfer signal is preferably input in the auxiliary word line through the inverter circuits of the transfer signal generation circuit in the number larger than the prescribed number. According to this structure, the semiconductor memory device can further delay the first transfer signal input in the auxiliary word line as compared with the row address selection signal input in the word lines due to the inverter circuits of the transfer signal generation circuits in the number larger than the prescribed number of the inverter circuits of the row decoder. Thus, the semiconductor memory device can input the first transfer signal for activating the auxiliary word line in the auxiliary word line after inputting the row address selection signal for activating the word lines in the word lines.

The aforementioned semiconductor memory device according to the first aspect preferably outputs data of a column of the single-port SRAM cells connected to a selected prescribed word line to the bit lines while transferring the data to the column of dual-port SRAM cells at the same time when transferring the data from the single-port SRAM cells to the dual-port SRAM cells. According to this structure, the semiconductor memory, capable of transferring data of the column of single-port SRAM cells connected to a prescribed word line to the dual-port SRAM cells at the same time by selecting the prescribed word line, can easily transfer the data from the single-port SRAM cells to the dual-port SRAM cells.

In the aforementioned semiconductor memory device according to the first aspect, the drivability ratio of a p-channel transistor to an n-channel transistor in each dual-port SRAM cell is larger than the drivability ratio of a p-channel transistor to an n-channel transistor in each single-port SRAM cell. According to this structure, the logical threshold of an inverter circuit of each dual-port SRAM cell constituted of the p- and n-channel transistors exceeds that of an inverter circuit of each single-port SRAM cell constituted of the p- and n-channel transistors. Thus, potential change necessary for inverting recorded data is reduced in each dual-port SRAM cell as compared with each single-port SRAM cell, whereby the semiconductor memory device can easily write data in the dual-port SRAM cell also when data output from the single-port SRAM cell is inverse to that originally written in the dual-port SRAM cell.

In this case, the drivability ratios of the p-channel transistors to the n-channel transistors in each dual-port SRAM cell and each single-port SRAM cell are preferably controlled through the ratios of the gate widths of the p-channel transistors to the gate widths of the n-channel transistors in each dual-port SRAM cell and each single-port SRAM cell or the ratios of the gate lengths of the p-channel transistors to the gate lengths of the n-channel transistors. According to this structure, the drivability ratio of the p-channel transistor to the n-channel transistor in each dual-port SRAM cell can be easily increased beyond the drivability ratio of the p-channel transistor to the n-channel transistor in each single-port SRAM cell by increasing the ratio of the gate width of the p-channel transistor to that of the n-channel transistor in each dual-port SRAM cell beyond the ratio of the gate width of the p-channel transistor to that of the n-channel transistor in each single-port SRAM cell, for example. Further, the drivability ratio of the p-channel transistor to the n-channel transistor in each dual-port SRAM cell can be easily increased beyond the drivability ratio of the p-channel transistor to the n-channel transistor in each single-port SRAM cell also by reducing the ratio of the gate length of the p-channel transistor to that of the n-channel transistor in each dual-port SRAM cell beyond the ratio of the gate length of the p-channel transistor to that of the n-channel transistor in each single-port SRAM cell.

A semiconductor memory device according to a second aspect of the present invention comprises a plurality of bit lines and a plurality of word lines arranged to intersect with each other, a single-port SRAM cell, connected to the bit lines and the word lines, having a single port for inputting/outputting data, a first row decoder and a second row decoder connected to the word lines for selecting a row address, and a first column decoder and a second column decoder connected to the bit lines for selecting a column address. Each word line is divided into a plurality of local word lines.

The aforementioned semiconductor memory device according to the second aspect, provided with the first and second row decoders and the first and second column decoders with the word lines each divided into a plurality of local word lines, can activate only local word lines corresponding to an address selected through the first row decoder and the first column decoder and an address selected through the second row decoder and the second column decoder respectively. Thus, the semiconductor memory device can activate two different local word lines corresponding to different addresses (column addresses) respectively at the same time. Therefore, the semiconductor memory device can activate two single-port SRAM cells connected with the simultaneously activated two different local word lines respectively at the same time. Thus, the semiconductor memory device, capable of activating only two different bit lines connected to the two single-port SRAM cells at the same time, can simultaneously write/read data in/from the two single-port SRAM cells through the two different bit lines. Therefore, the semiconductor memory device can be simultaneously accessed through two different systems. Consequently, access from a second system can be inhibited from entering the wait state during access through a first system, whereby the operating speed of the semiconductor memory device can be improved.

According to the second aspect, further, the semiconductor device, provided with the word lines each divided into a plurality of local word lines so that only a local word line corresponding to a row address selected through the first and second row decoders and a column address selected through the first and second column decoders can be activated, can suppress activation of all bit lines following activation of a single word line dissimilarly to a conventional semiconductor memory device employing undivided word lines. Thus, the number of bit lines activated following activation of the word line can be so reduced that power consumption of the semiconductor memory device can be reduced. Further, the semiconductor memory device is so constituted of the single-port SRAM cells that the area of a memory cell array region formed with the single-port SRAM cells can be reduced as compared with a semiconductor memory device constituted of dual-port SRAM cells due to the small numbers of the bit lines and transistors. Consequently, the semiconductor memory device can be further miniaturized as compared with the semiconductor memory device constituted of dual-port SRAM cells.

The aforementioned semiconductor memory device according to the second aspect preferably activates the local word lines in response to at least either address selection signals from the first row decoder and the first column decoder or address selection signals from the second row decoder and the second column decoder. According to this structure, the semiconductor memory device can easily activate only local word lines corresponding to an address selected through the first row decoder and the first column decoder and an address selected through the second row decoder and the second column decoder respectively. Thus, the semiconductor memory device can easily activate two different local word lines corresponding to different addresses (column addresses) respectively at the same time.

In the aforementioned semiconductor memory device according to the second aspect, the word lines are preferably so constituted that two local word lines corresponding to a first address selected through the first row decoder and the first column decoder and a second address selected through the second row decoder and the second column decoder respectively are activated at the same time. According to this structure, the semiconductor memory device can activate two single-port SRAM cells connected to the simultaneously activated local word lines of the first and second addresses respectively at the same time. Thus, the semiconductor memory device can write and read data in and from the two single-port SRAM cells through two different bit lines connected to the two single-port SRAM cells respectively. Therefore, the semiconductor memory device can be easily accessed through two systems at the same time.

The aforementioned semiconductor memory device according to the second aspect preferably further comprises a sub decoder circuit for supplying a signal obtained by ANDing at least either two address selection signals from the first row decoder and the first column decoder or two address selection signals from the second row decoder and the second column decoder and activating the AND to the local word lines. According to this structure, the semiconductor memory device can easily activate only local address word lines of two addresses selected through the first row decoder and the first column decoder and through the second row decoder and the second column decoder by supplying the address selection signals from the first row decoder and the first column decoder to the corresponding sub decoder circuit and supplying the address selection signals from the second row decoder and the second column decoder to the corresponding sub decoder circuit.

In this case, the sub decoder circuit is preferably provided every local word line, and two sub decoder circuits adjacent to each other along the extensional direction of the bit lines preferably partially share transistors constituting the sub decoder circuits. According to this structure, the number of transistors constituting each sub decoder circuit can be so reduced that the size of the sub decoder circuit can be reduced.

The aforementioned semiconductor memory device according to the second aspect preferably further comprises access means for writing substantially simultaneously received data of prescribed capacity in different addresses in different cycles every prescribed bit unit. According to this structure, the semiconductor memory device can easily write data of prescribed capacity simultaneously received therein in different cycles every prescribed bit unit while writing the simultaneously received data of the prescribed capacity in single-port SRAM cells of different addresses every prescribed bit unit.

In this case, the access means preferably includes a plurality of access circuit parts provided every prescribed bit unit, and the plurality of access circuit parts preferably write the data of the prescribed bit unit in different addresses in different cycles respectively. According to this structure, the access means for writing the substantially simultaneously received data of prescribed capacity in different addresses in different cycles every prescribed bit unit can be easily obtained.

In this case, further, the plurality of access circuit parts preferably include write latch circuit parts receiving write signals and holding the data of the prescribed bit unit respectively, and the write latch circuit parts preferably write the data of the prescribed bit unit when receiving first write signals while not writing the data of the prescribed bit unit when receiving second write signals. According to this structure, the semiconductor memory device can easily write the data of the prescribed bit unit in different cycles through the write latch circuit parts of the access circuit parts by inputting the first write signals in the write latch circuit parts for writing data while inputting the second write signals in the write latch circuit parts for writing no data.

In the aforementioned structure including the access means, the access means preferably individually writes or reads data every prescribed bit unit. According to this structure, the semiconductor memory device can read data of a bit unit other than the bit unit for writing while writing data of the prescribed bit unit.

In this case, the access means preferably includes a plurality of access circuit parts provided every prescribed bit unit, the plurality of access circuit parts preferably include read latch circuits holding data to be read every prescribed bit unit respectively, and a plurality of read latch circuit parts are preferably individually controlled every prescribed bit unit. According to this structure, the semiconductor memory device can easily individually write or read data every prescribed bit unit through the plurality of read latch circuit parts.

The aforementioned semiconductor memory device according to the second aspect preferably further comprises access means for writing data of a prescribed bit unit received in different cycles substantially at the same time. According to this structure, the semiconductor memory device can easily write the data of the prescribed bit unit received therein in different cycles in the single-port SRAM cells substantially at the same time through the access means.

In this case, the access means preferably includes a plurality of access circuit parts provided every prescribed bit unit, and the plurality of access circuit parts preferably hold the data of the prescribed bit unit received in the different cycles and thereafter write the data substantially at the same time. According to this structure, the access means for writing data of the prescribed bit unit input in different cycles substantially at the same time can be easily obtained.

In this case, further, the plurality of access circuit parts preferably include write latch circuit parts receiving write signals and holding the data of the prescribed bit unit respectively, and the write latch circuit parts preferably write the data of the prescribed bit unit when receiving first write signals while not writing the data of the prescribed bit unit when receiving second write signals. According to this structure, the semiconductor memory device can easily write data of the prescribed bit unit input in different cycles substantially at the same time through the write latch circuit parts of the access circuit parts by inputting the second write signals in the write latch circuits while inputting the data of the prescribed bit unit in different cycles and thereafter inputting the first write signals in the write latch circuit parts in a data write cycle.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

The structure of a semiconductor memory device 50 according to a first embodiment of the present invention is described with reference to FIGS. 1 to 6.

Figure 1:
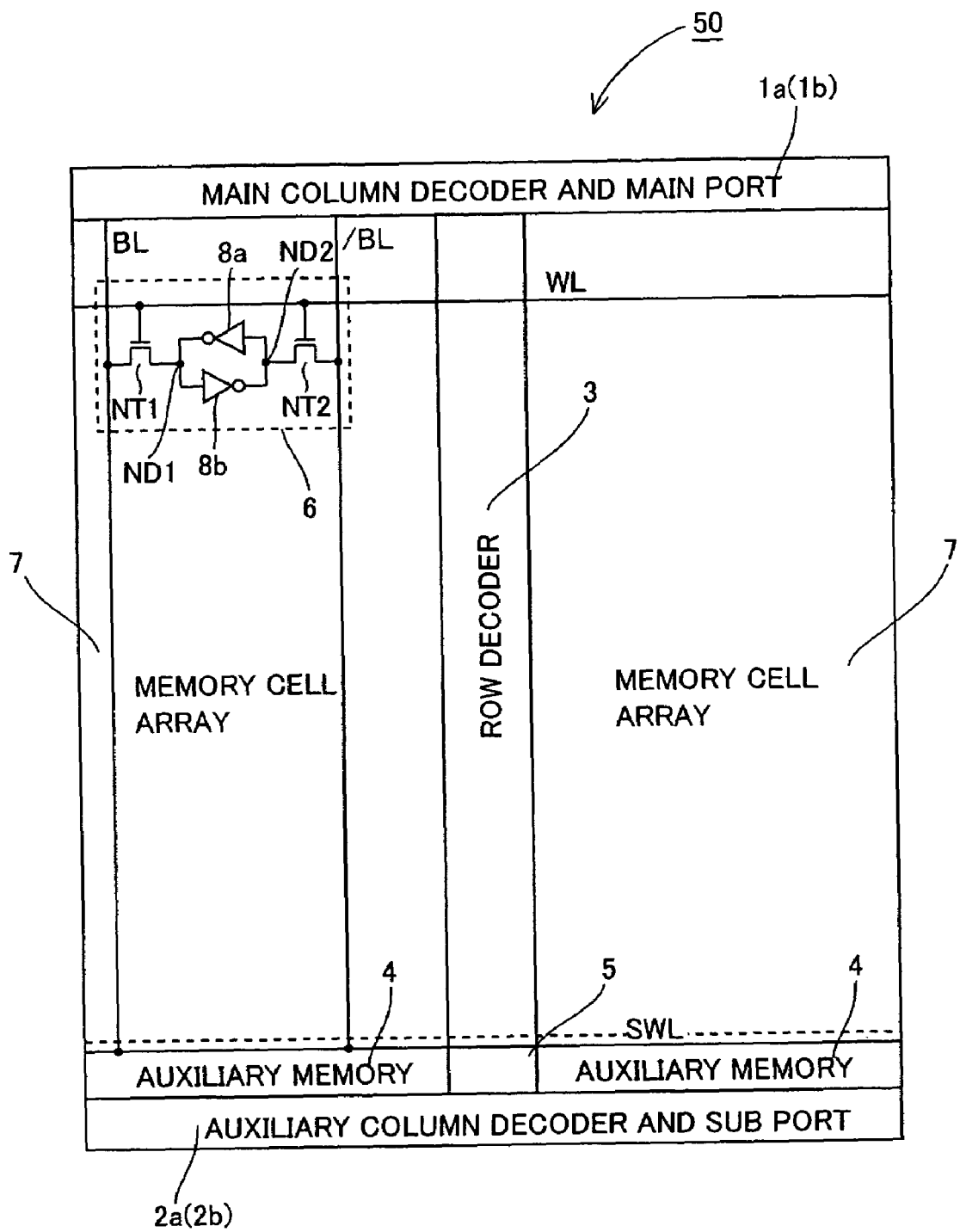
FIG. 1 is a plan view showing the structure of a semiconductor memory device according to a first embodiment of the present invention.

As shown in FIG. 1, the semiconductor memory device 50 according to the first embodiment of the present invention comprises a main column decoder 1*a* and an auxiliary column decoder 2*a* for selecting column addresses as well as a row decoder 3 for selecting row addresses. The main column decoder 1*a* includes a main port 1*b* for externally inputting/outputting data. The auxiliary column decoder 2*a* includes a sub port 2*b* for externally outputting data. The row decoder 3 is provided on the central portion of the semiconductor memory device 50. A transfer signal generation circuit 5 for supplying a transfer signal TF etc. to auxiliary memories 4 described later is provided on an end of the row decoder 3 closer to the auxiliary column decoder 2a. Two memory cell arrays 7 formed with single-port SRAM cells 6 etc. are provided on both sides of the row decoder 3 respectively. A plurality of word lines WL and a plurality of pairs of bit lines BL and /BL are arranged on each memory cell array 7 to intersect with each other. While FIG. 1 shows only one word line WL and a pair of bit lines BL and /BL, each memory cell array 7 of the semiconductor memory device 50 according to the first embodiment is provided with the plurality of word lines WL and the plurality of pairs of bit lines BL and /BL in practice. The plurality of word lines WL are connected to the row decoder 3, while the plurality of pairs of bit lines BL and /BL are connected to the main column decoder 1a.

The single-port SRAM cells 6, each having a single port, are arranged on the intersectional positions between the plurality of word lines WL and the plurality of pairs of bit lines BL and /BL respectively. The single-port SRAM cells 6 are connected to the word lines WL and the plurality of pairs of bit lines BL and /BL respectively. Each single-port SRAM cell 6 is constituted of two inverter circuits 8a and 8b and two n-channel transistors NT1 and NT2. In each single-port SRAM cell 6, an output from the first one of the two inverter circuits 8a and 8b is input in an input of the second one, while an output from the second one is input in an input of the first one. One of the source and the drain of the n-channel transistor NT1 is connected to a node ND1 connected to the output side of the inverter circuit 8a and the input side of the inverter circuit 8b, while the other one of the source and the drain is connected to the corresponding bit line BL. One of the source and the drain of the n-channel transistor NT2 is connected to another node ND2 connected to the output side of the inverter circuit 8b and the input side of the inverter circuit 8a, while the other one of the source and the drain is connected to the corresponding inverted bit line /BL. The gates of the n-channel transistors NT1 and NT2 are connected to the corresponding word line WL. The n-channel transistors NT1 and NT2 constitute the single port of each single-port SRAM cell 6.

Figure 2:
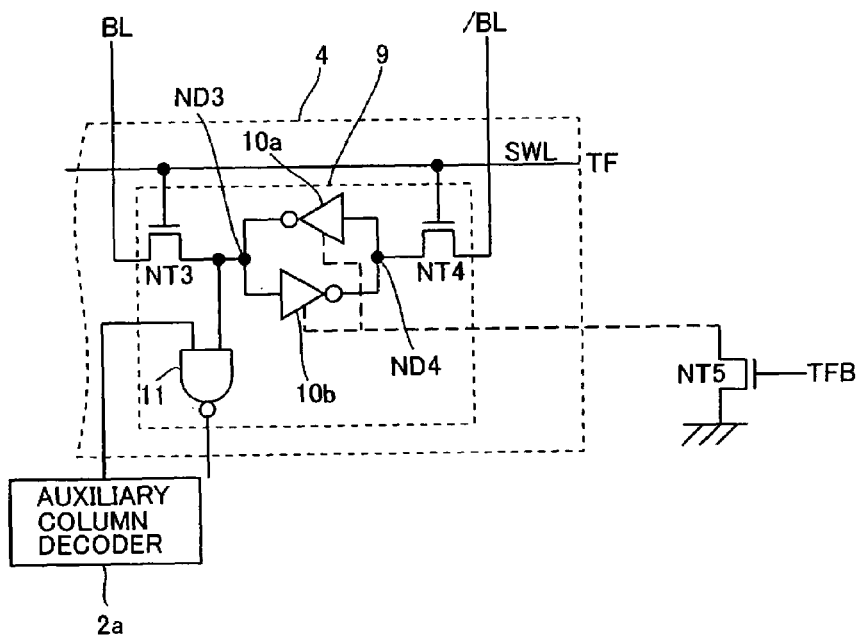
FIG. 2 is an enlarged circuit diagram of an auxiliary memory part in the semiconductor memory device according to the first embodiment shown in FIG. 1.
Figure 3:
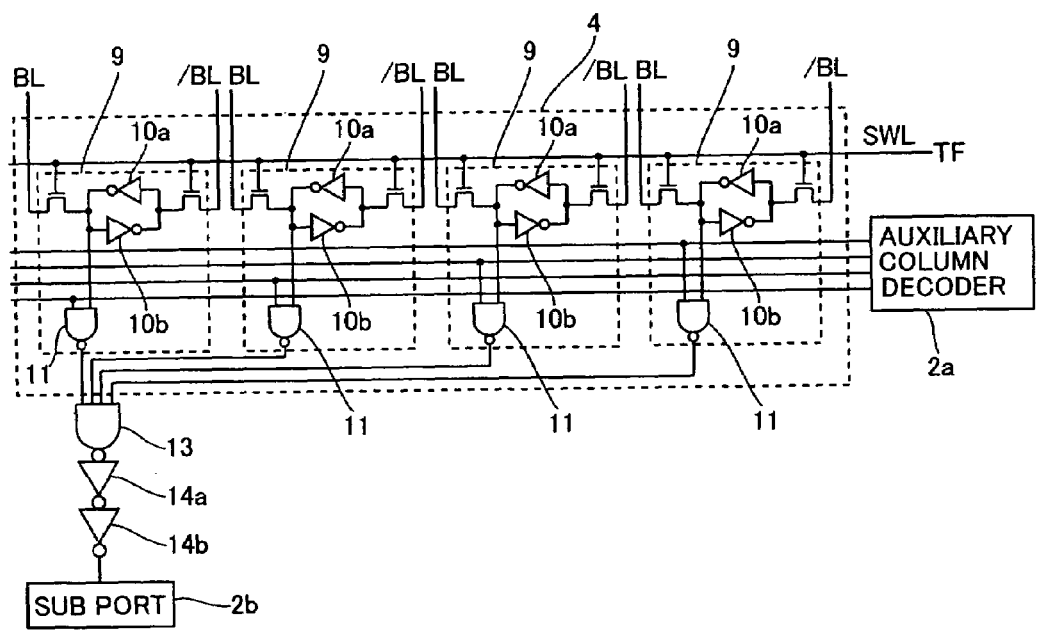
FIG. 3 is a circuit diagram of the auxiliary memory part in the semiconductor memory device according to the first embodiment shown in FIG. 1.

According to the first embodiment, a single auxiliary word line SWL is arranged on ends of the memory cell arrays 7 closer to the auxiliary column decoder 2a while auxiliary memories 4 each including a column of dual-port SRAM cells 9 are provided along the auxiliary word line SWL, as shown in FIGS. 1 to 3. While FIG. 2 shows only a single dual-port SRAM cell 9 and FIG. 3 shows only four dual-port SRAM cells 9, each dual-port SRAM cell 9 is provided every pair of bit lines BL and /BL according to the first embodiment. As shown in FIG. 2, each dual-port SRAM cell 9 is constituted of two inverter circuits 10a and 10b, a NAND circuit 11 and two n-channel transistors NT3 and NT4. In each dual-port SRAM cell 9, an output of the first one of the two inverter circuits 10a and 10b is connected to an input side of the second one, while an output of the second one is connected to an input side of the first one. The drain of an n-channel transistor NT5 is connected to the two inverter circuits 10a and 10b respectively. The source of the n-channel transistor NT5 is connected to a ground potential GND. An inverted transfer signal TFB obtained by inverting the transfer signal TF supplied to the auxiliary word line SWL is supplied to the gate of the n-channel transistor NT5. The transfer signal TF and the inverted transfer signal TFB are examples of the "first transfer signal" and the "second transfer signal" in the present invention respectively.

According to the first embodiment, a first port of each dual-port SRAM cell 9 for writing and reading data is connected to the corresponding pair of bit lines BL and /BL. More specifically, the n-channel transistors NT3 and NT4 constitute the first port of each dual-port SRAM cell 9. One of the source and the drain of the n-channel transistor NT3 is connected to a node ND3 connected to the output side of the inverter circuit 10a and the input side of the inverter circuit 10b, while the other one of the source and the drain is connected to the corresponding bit line BL. One of the source and the drain of the n-channel transistor NT4 is connected to a node ND4 connected to the output side of the inverter circuit 10b and the input side of the inverter circuit 10a, while the other one of the source and the drain is connected to the corresponding inverted bit line /BL. The gates of the N-channel transistors NT3 and NT4 are connected to the auxiliary word line SWL, which in turn is supplied with the transfer signal TF.

According to the first embodiment, a second port of each dual-port SRAM cell 9 is not connected to the corresponding pair of bit lines BL and /BL but dedicated to data reading from the dual-port SRAM cell 9, as shown in FIG. 2. More specifically, the NAND circuit 11 constitutes the second port of each dual-port SRAM cell 9. An input side of the NAND circuit 11 receives a data signal from the node ND and a column address selection signal from the auxiliary column decoder 2a. Thus, the NAND circuit 11 outputs a signal obtained by ANDing the data signal for the dual-port SRAM cell 9 and the column address selection signal from the auxiliary column decoder 2a. More specifically, the NAND circuit 11 outputs a low-level signal only when the NAND circuit 11 receives a high-level column address selection signal from the auxiliary column decoder 2a while receiving a high-level data signal through the node ND3.

As shown in FIG. 3, signals output from the NAND circuits 11 of four adjacent dual-port SRAM cells 9 are input in a NAND circuit 13. Thus, the NAND circuit 13 outputs a signal obtained by ANDing the signals output from the four adjacent dual-port SRAM cells 9. The signal output from the NAND circuit 13 is input in the sub port 2b through two inverter circuits 14a and 14b, and output from the sub port 2b.

Figure 4:
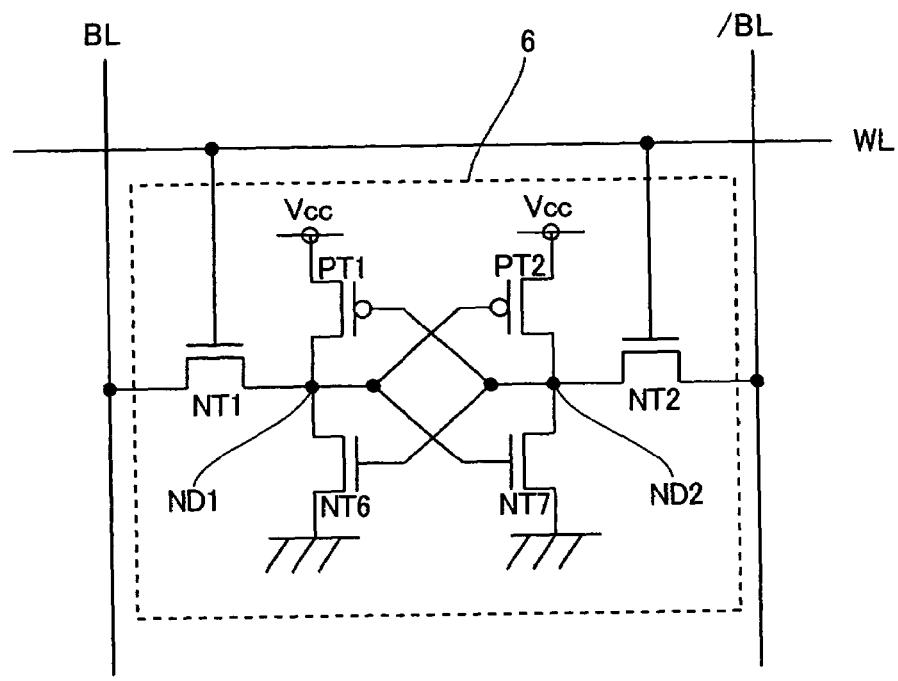
FIG. 4 is a circuit diagram of a single-port SRAM cell part in the semiconductor memory device according to the first embodiment shown in FIG. 1.
Figure 5:
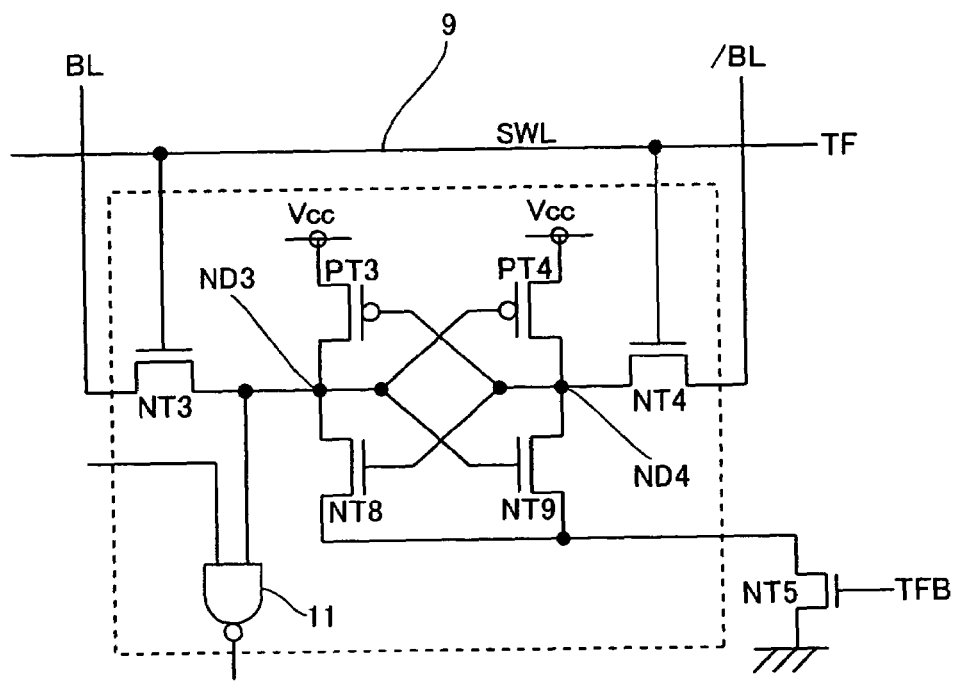
FIG. 5 is a circuit diagram showing a dual-port SRAM cell part of the auxiliary memory in the semiconductor memory device according to the first embodiment shown in FIG. 1.

As shown in FIG. 4, each single-port SRAM cell 6 formed on each memory cell array 7 (see FIG. 1) is constituted of six transistors in total, i.e., four n-channel transistors NT1, NT2, NT6 and NT7 and two p-channel transistors PT1 and PT2. In each single-port SRAM cell 6, inputs/outputs of a CMOS inverter consisting of the n-channel transistor NT6 and the p-channel transistor PT1 and a CMOS inverter consisting of the n-channel transistor NT7 and the p-channel transistor PT2 are cross-coupled with each other. On the other hand, each dual-port SRAM cell 9 of each auxiliary memory 4 (see FIGS. 1 to 3) is constituted of six transistors in total, i.e., four n-channel transistors NT3, NT4, NT8 and NT9 and two p-channel transistors PT3 and PT4, as shown in FIG. 5. In each dual-port SRAM cell 9, further, inputs/outputs of a CMOS inverter consisting of the n-channel transistor NT8 and the p-channel transistor PT3 and a CMOS inverter consisting of the n-channel transistor NT9 and the p-channel transistor PT4 are cross-coupled with each other, similarly to the aforementioned single-port SRAM cell 6.

According to the first embodiment, the drivability ratio of the p-channel transistors PT3 and PT4 to the n-channel transistors NT8 and NT9 in each dual-port SRAM cell 9 is larger than the drivability ratio of the p-channel transistors PT1 and PT2 to the n-channel transistors NT6 and NT7 in each single-port SRAM cell 6 (see FIG. 4). Thus, logical thresholds of the inverter circuit 10a (see FIG. 2) constituted of the n-channel transistor PT3 and the n-channel transistor NT8 and the inverter circuit 10b (see FIG. 2) constituted of the p-channel transistor PT4 and the n-channel transistor NT9 in each dual-port SRAM cell 9 are higher than logical thresholds of the inverter circuit 8a (see FIG. 1) constituted of the p-channel transistor PT1 and the n-channel transistor NT6 and the inverter circuit 8b (see FIG. 1) constituted of the p-channel transistor PT2 and the n-channel transistor NT7 in each single-port SRAM cell 6. The drivability ratio of the p-channel transistors PT3 and PT4 to the n-channel transistors NT8 and NT9 in the dual-port SRAM cell 9 can be increased beyond the drivability ratio of the p-channel transistors PT1 and PT2 to the n-channel transistors NT6 and NT7 in the single-port SRAM cell 6 by increasing the ratio of the gate widths of the p-channel transistors PT3 and PT4 to the gate widths of the n-channel transistors NT8 and NT9 in the dual-port SRAM cell 9 beyond the ratio of the gate widths of the p-channel transistors PT1 and PT2 to the gate widths of the n-channel transistors NT6 and NT7 in the single-port SRAM cell 6 or reducing the ratio of the gate lengths of the p-channel transistors PT3 and PT4 to the gate lengths of the n-channel transistors NT8 and NT9 in the duel-port SRAM cell 9 beyond the ratio of the gate lengths of the p-channel transistors PT1 and PT2 to the gate lengths of the n-channel transistors NT6 and NT7 in the single-port SRAM cell 6.

Figure 6:
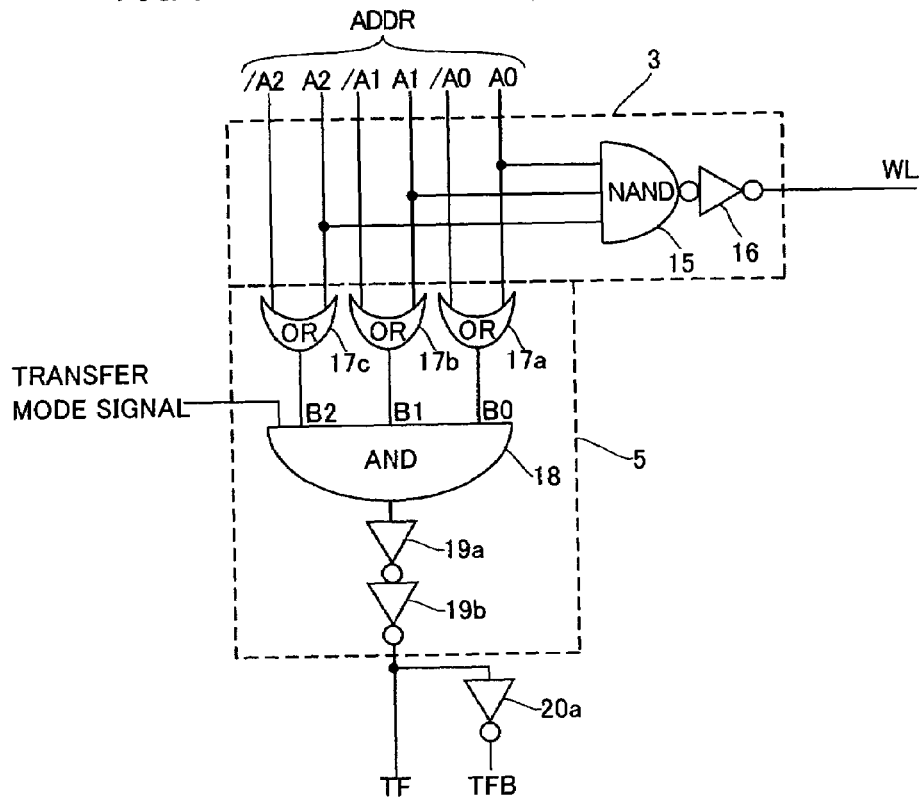
FIG. 6 illustrates logic circuits of a row decoder and a transfer signal generation circuit part in the semiconductor memory device according to the first embodiment shown in FIG. 1.

The row decider 3 and the transfer signal generation circuit 5 (see FIG. 1) are constituted of logic circuits shown in FIG. 6. More specifically, a plurality of address signals A0, /A0, A1, /A1, A2 and /A2 are input in the row decoder 3. The address signals A0, A1 and A2 received in the row decoder 3 are input in a NAND circuit 15 of the row decoder 3. Thus, the NAND circuit 15 outputs a signal obtained by ANDing the address signals A0, A1 and A2. The NAND circuit 15 outputs this signal to the word lines WL through an inverter circuit 16. Thus, the row decoder 3 supplies a row address selection signal to the word lines WL.

Further, the address signals A0 and /A0, A1 and /A1 and A2 and /A2 are input in the transfer signal generation circuit 5. The address signals A0 and /A0, A1 and /A1 and A2 and /A2 received in the transfer signal generation circuit 5 are input in OR circuits 17a, 17b and 17c of the transfer signal generation circuit 5 respectively. Thus, the OR circuits 17a, 17b and 17c output a signal B0 obtained by activating one of the address signals A0 and /A0, a signal B1 obtained by activating one of the address signals A1 and /A1 and a signal B2 obtained by activating one of the address signals A2 and /A2 respectively. The signals B0 to B2 output from the OR circuits 17a, 17b and 17c and a transfer mode signal are input in an AND circuit 18. Thus, the AND circuit 18 outputs a signal obtained by ANDing the signals B0 to B2. The signal output from the AND circuit 18 is input in the auxiliary word line SWL (see FIG. 2) through two inverter circuits 19a and 19b. Thus, the transfer signal generation circuit 5 supplies the transfer signal TF to the auxiliary word line SWL. An inverter circuit 20a connected to the inverter circuit 19b outputs the inverted transfer signal TFB obtained by inverting the transfer signal TF. The inverted transfer signal TFB is input in the n-channel transistor NT5 (see FIG. 2). Thus, the transfer signal TF rises in a slight delay from the word lines WL.

Figure 7:
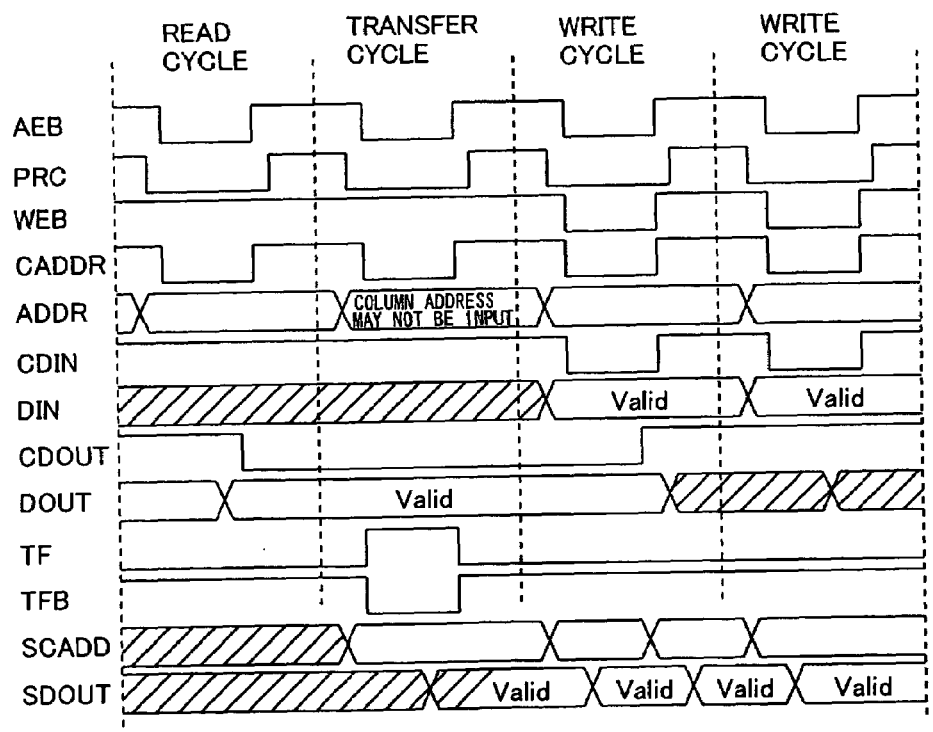
FIG. 7 is a timing chart for illustrating operations of the semiconductor memory device according to the first embodiment shown in FIG. 1.

Operations of the semiconductor memory device 50 according to the first embodiment of the present invention are described with reference to FIGS. 1 to 3, 6 and 7. Referring to FIG. 7, slant portions indicate that some indefinite data are output.

In a cycle for reading data from the main port 1b, a high-level precharge signal PRC is externally supplied through the main port 1b (see FIG. 1) for precharging the pairs of bit lines BL and /BL. The precharge signal PRC goes low thereby completing precharging of the pairs of bit lines BL and /BL. Then, an address latch signal CADDR goes low so that a definite address signal ADDR is input in the row decoder 3 and the main column decoder 1a through the main port 1b. An inverted address enable signal AEB goes low so that the row decoder 3 supplies a high-level row address selection signal to the word line WL of the row address corresponding to the address signal ADDR. Thus, the word line WL supplied with the high-level row address signal goes high.

When the word line WL goes high, the n-channel transistors NT1 and NT2 of the column of single-port SRAM cells 6 connected to this word line WL are turned on. In this state, the main column decoder 1a selects the pair of bit lines BL and /BL of the column address corresponding to the address signal ADDR, whereby data of the single-port SRAM cell 6 connected to the selected pair of bit lines BL and /BL and the high-level word line WL is input in the main port 1b through the pair of bit lines BL and /BL and the main column decoder 1a. Thus, the main port 1b outputs a data output signal DOUT. A data output latch signal CDOUT goes low, thereby defining the output data output signal DOUT. Thus, the data output signal DOUT is defined as valid data. Thereafter the address latch signal CADDR and the inverted address enable signal AEB go high. The precharge signal PRC goes high, thereby starting precharging the pairs of bit lines BL and /BL.

In the cycle for reading data from the main port 1b, a low-level transfer signal TF is input in the auxiliary word lien SWL while a high-level inverted transfer signal TFB is input in the gate of the n-channel transistor NT5 (see FIG. 2). Thus, the n-channel transistors NT3 and NT4 of each dual-port SRAM cell 9 are turned off while the n-channel transistor NT5 is turned on. Therefore, the dual-port SRAM cell 9 is cut off from inputs through the corresponding pair of bit lines BL and /BL, while the n-channel transistor NT5 and the ground potential GND are connected to the two inverter circuits 10a and 10b of the dual-port SRAM cell 9. Thus, the dual-port SRAM cell 9 holds data originally recorded therein as such.

In a transfer cycle for transferring data of any single-port SRAM cells 6 of either memory cell array 7 to any dual-port SRAM cells 9 of either auxiliary memory 4, the pairs of bit lines BL and /BL are precharged and the word line WL of the row address corresponding to the address signal ADDR goes high through an operation similar to that in the aforementioned cycle for reading data from the main port 1b. In this transfer cycle, data of the column of single-port SRAM cells 6 connected to the high-level word line WL are simultaneously transferred to the corresponding dual-port SRAM cells 9 of the corresponding auxiliary memory 4, whereby no column address may be input through the address signal ADDR. In this case, the n-channel transistors NT1 and NT2 of the column of single-port SRAM cells 6 connected to the high-level word line WL are turned on.

At this time, the data of the column of single-port SRAM cells 6 connected to the high-level word line WL are output to the corresponding pairs of bit lines BL and /BL at the same time. The main column decoder 1a is inactive in the transfer cycle, and hence the single-port SRAM cells 6 cannot be accessed through the main port 1b through the pairs of bit lines BL and /BL. As shown in FIG. 6, the address signal ADDR (A0, /A0, A1, /A1, A2 and /A2) input in the transfer signal generation circuit 5 through the row decoder 3 is supplied to the auxiliary word line SWL (see FIG. 2) as the transfer signal TF through the OR circuits 17a, 17b and 17c, the AND circuit 18 and the two inverter circuits 19a and 19b. Thus, the auxiliary word line SWL goes high. In this case, an output signal from the transfer signal generation circuit 5 constituted of the four-stage logic circuits 17a to 17c, 18, 19a and 19b delays from that of a circuit for activating the word lines WL formed by the two-stage logic circuits 15 and 16. Thus, a signal for activating the auxiliary word line SWL supplied from the transfer signal generation circuit 5 delays from a signal for activating the word lines WL.

Thus, the auxiliary word line SWL connected with the dual-port SRAM cells 9 (see FIG. 2) goes high after the word lines WL connected with the single-port SRAM cells 6 (see FIG. 1) go high in the first embodiment. Further, a high-level transfer signal TF is input in the auxiliary word line SWL while a low-level inverted transfer signal TFB is input in the gate of the n-channel transistor NT5 of the transfer signal generation circuit 5, whereby the n-channel transistors NT3 and NT4 of the dual-port SRAM cells 9 are turned on while the n-channel transistor NT5 of the transfer signal generation circuit 5 is turned off. Therefore, data can be written in the dual-port SRAM cells 9 through the pairs of bit lines BL and /BL, while the pairs of inverter circuits 10a and 10b of the dual-port SRAM cells 9 are cut off from connection with the ground potential GND. Thus, data recorded in the dual-port SRAM cells 9 are undefined.

At this time, data of the column of single-port SRAM cells 6 output to the corresponding pair of bit lines BL and /BL are simultaneously transferred to the corresponding column of dual-port SRAM cells 9. The transferred data are written in the dual-port SRAM cells 9 without colliding with those recorded in the dual-port SRAM cells 9.

Then, the transfer signal TF goes low and the inverted transfer signal TFB goes high, thereby turning off the n-channel transistors NT3 and NT4 of the dual-port SRAM cells 9 and turning on the n-channel transistor NT5 of the transfer signal generation circuit 5. Therefore, data input from the pair of bit lines BL and /BL in the corresponding dual-port SRAM cells 9 is cut off while the pairs of inverter circuits 10a and 10b of the dual-port SRAM cells 9 are connected with the ground potential GND through the n-channel transistor NT5. Thus, the data written in the dual-port SRAM cells 9 are defined. Due to this definition of the data written in the dual-port SRAM cells 9, a sub data output signal SDOUT is defined as valid data. At the same timing as or after the transfer signal TF goes low and the inverted transfer signal TFB goes high, the address latch signal CADDR and the inverted address enable signal AEB go high. Thereafter the precharge signal PRC goes high thereby starting precharging the pairs of bit lines BL and /BL.

In a cycle for writing data from the main port 1b, the pairs of bit lines BL and /BL are precharged and the word line WL of the row address corresponding to the address signal ADDR goes low through an operation similar to that in the aforementioned read cycle. The n-channel transistors NT1 and NT2 of the column of single-port SRAM cells 6 connected to the high-level word line WL are turned on while the main column decoder 1a selects the pair of bit lines BL and /BL of the column address corresponding to the address signal ADDR.

A data latch signal CDIN goes low for latching data (input signal DIN) input in the main port 1b. An inverted write enable signal WEB goes low for supplying the latched data to the selected pair of bit lines BL and /BL through the main column decoder 1a. The data supplied to the selected pair of bit lines BL and /BL is written in a selected single-port SRAM cell 6 through the selected pair of bit lines BL and /BL. Thereafter the data output latch signal CDOUT goes high, whereby the data output signal DOUT output from the main port 1b is undefined. The address latch signal CADDR and the inverted address enable signal AEB go high. Thereafter the precharge signal PRC goes high thereby starting precharging the pairs of bit lines BL and /BL.

In this cycle of writing data from the main port 1b, a low-level transfer signal TF is input in the auxiliary word line SWL while a high-level inverted transfer signal TFB is input in the gate of the n-channel transistor NT5 of the transfer signal generation circuit 5 on the side of the sub port 2b, whereby the sub port 2b outputs a sub data output signal SDOUT. More specifically, the auxiliary column decoder 2a receives a sub address signal SCADD thereby supplying a high-level column address selection signal to the dual-port SRAM cell 9 of the address corresponding to the sub address signal SCADD. The auxiliary column decoder 2a supplies a high-level column address selection signal to any selected dual-port SRAM cell 9 while supplying a low-level column address selection signal to nonselected dual-port SRAM cells 9.

The high-level column address selection signal supplied to the dual-port SRAM cell 9 is supplied to the NAND circuit 11 of the auxiliary column decoder 2a (see FIG. 2), whereby the NAND circuit 11 outputs a signal obtained by ANDing the high-level column address selection signal and a data signal for the dual-port SRAM cell 9. When the dual-port SRAM cell 9 records a high-level data signal, for example, the NAND circuit 11 outputs a low-level signal. When the dual-port SRAM cell 9 records a low-level data signal, on the other hand, the NAND circuit 11 outputs a high-level signal.

As shown in FIG. 3, signals output from the four adjacent dual-port SRAM cells 9 are input in the NAND circuit 13. Thus, the NAND circuit 13 outputs a signal obtained by ANDing the signals output from the four adjacent dual-port SRAM cells 9. In this case, the NAND circuits 11 of the nonselected dual-port SRAM cells 9 input high-level signals in the NAND circuit 13, whereby the signal output from the NAND circuit 13 goes high or low depending on the signal received therein from the NAND circuit 11 of the selected dual-port SRAM cell 9. The signal output from the NAND circuit 13 is input in the sub port 2b through the two inverter circuits 14a and 14b. Therefore, the sub port 2b outputs a sub data output signal SDOUT. Consequently, the sub port 2b outputs the data of the selected dual-port SRAM cell 9.

Thus, no sub-side bit lines are required while a sub-side sense amplifier can be omitted either.

In this write cycle, a defined sub address signal SCADD so input that the sub port 2b outputs a valid sub data output signal SDOUT. Thus, data (sub data output signal SDOUT) can be read from the sub pot 2b while writing data (data input signal DIN) from the main port 1b.

A second cycle of writing data from the main port 1b is then performed. The operation of the second write cycle is similar to that of the aforementioned first write cycle.

According to the first embodiment, as hereinabove described, the auxiliary memories 4 each including the column of dual-port SRAM cells 9 arranged along the auxiliary word line SWL are provided on the ends of the memory cell arrays 7 each including the plurality of single-port SRAM cells 6 closer to the auxiliary column decoder 2a while the bit lines BL and /BL are connected to the n-channel transistors NT3 and NT4 constituting the first ports of the dual-port SRAM cells 9 respectively, whereby the data of the single-port SRAM cells 6 can be transferred to the dual-port SRAM cells 9 of the auxiliary memories 4 through the pairs of bit lines BL and /BL while the data transferred to the dual-port SRAM cells 9 can be read from the second ports of the dual-port SRAM cells 9 not connected to the pairs of bit lines BL and /BL. Therefore, data can be simultaneously read from the dual-port SRAM cells 9 of the auxiliary memories 4 while data are written in or read from the single-port SRAM cells 6 through the pairs of bit lines BL and /BL. Thus, data can be read through a second system during access to the semiconductor memory device 50 through a first system, dissimilarly to a semiconductor memory device constituted of only single-port SRAM cells similar to the single-port SRAM cells 6. Therefore, data reading through the second system can be inhibited from entering the wait state during access through the first system. Consequently, the operating speed of the semiconductor memory device 50 can be improved.

According to the first embodiment, only the column of dual-port SRAM cells 9 may be provided for improving the operating speed of the semiconductor memory device 50, whereby the numbers of the bit lines BL and /BL and the word lines WL and those of the transistors constituting the semiconductor memory device 50 can be reduced as compared with a semiconductor memory device constituted of only dual-port SRAM cells 209. Thus, the areas of the memory cell arrays 7 can be reduced as compared with the semiconductor memory device constituted of only the dual-port SRAM cells 209, due to the reduction of the numbers of the bit lines BL and /BL and the word lines WL and those of the transistors. Consequently, the semiconductor memory device 50 can be inhibited from size increase as compared with the semiconductor memory device constituted of only the dual-port SRAM cells 209.

According to the first embodiment, further, the semiconductor memory device 50 is so constituted of only the SRAM cells (the single-port SRAM cells 6 and the dual-port SRAM cells 9) having smaller power consumption than DRAM cells that power consumption of the semiconductor memory device 50 can be reduced as compared with a semiconductor memory device constituted of DRAM cells.

According to the first embodiment, the pairs of inverter circuits 10a and 10b of the dual-port SRAM cells 9 are connected to the ground potential GND through the n-channel transistor NT5 while the transfer signal TF and the inverted transfer signal TFB are input in the auxiliary word line SWL and the gate of the n-channel transistor NT5 respectively so that the gate of the n-channel transistor NT receives a low-level inverted transfer signal TFB when the auxiliary word line SWL receives a high-level transfer signal TF, whereby the n-channel transistors NT3 and NT4 of the dual-port SRAM cells 9 connected to the auxiliary word line SWL are turned on and the n-channel transistor NT5 can be turned off. When the n-channel transistors NT3 and NT4 of the dual-port SRAM cells 9 are turned on, therefore, the connection between the pairs of inverter circuits 10a and 10b of the dual-port SRAM cells 9 and the ground potential GND is cut off, whereby sides of the nodes ND3 and ND4 of the dual-port SRAM cells 9 outputting low-level signals enter floating states when the n-channel transistors NT3 and NT4 of the dual-port SRAM cells 9 are turned on. Thus, new data can be easily written in the dual-port SRAM cells 9. When the auxiliary word line SWL receives a low-level transfer signal TF, on the other hand, the gate of the n-channel transistor NT receives a high-level inverted transfer signal TFB, whereby the n-channel transistors NT3 and NT4 of the dual-port SRAM cells 9 connected with the auxiliary word line SWL are turned off and the n-channel transistor NT5 can be turned on. Thus, data input from the pairs of bit lines BL and /BL in the dual-port SRAM cells 9 is cut off while the pairs of inverter circuits 10a and 10b of the dual-port SRAM cells 9 are connected to the ground potential GND, whereby the data written in the dual-port SRAM cells 9 can be held.

According to the first embodiment, further, the auxiliary word line SWL connected with the dual-port SRAM cells 9 goes high after the word line WL connected with the single-port SRAM cells 6 goes high in the transfer cycle so that the n-channel transistors NT3 and NT4 of the dual-port SRAM cells 9 can be turned on after the n-channel transistors NT1 and NT2 of the single-port SRAM cells 6 are turned on, whereby the n-channel transistors NT3 and NT4 of the dual-port SRAM cells 9 can be turned on after the single-port SRAM cells 6 output data to the pairs of bit lines BL and /BL. Also when the data output from the single-port SRAM cells 6 collide with data recorded in the dual-port SRAM cells 9, therefore, the former take precedence over the latter. Therefore, the data output from the single-port SRAM cells 6 can be inhibited from destruction resulting from collision with the data of the dual-port SRAM cells 9.

According to the first embodiment, in addition, the drivability ratio of the p-channel transistors PT3 and PT4 to the n-channel transistors NT8 and NT9 in each dual-port SRAM cell 9 is so rendered larger than the drivability ratio of the p-channel transistors PT1 and PT2 to the n-channel transistors NT6 and NT7 in each single-port SRAM cell 6 that the logical thresholds of the inverter circuit 10a constituted of the n-channel transistor PT3 and the n-channel transistor NT8 and the inverter circuit 10b constituted of the p-channel transistor PT4 and the n-channel transistor NT9 in each dual-port SRAM cell 9 are higher than the logical thresholds of the inverter circuit 8a constituted of the p-channel transistor PT1 and the n-channel transistor NT6 and the inverter circuit 8b constituted of the p-channel transistor PT2 and the n-channel transistor NT7 in each single-port SRAM cell 6. Thus, a potential change necessary for inverting recorded data is reduced in each dual-port SRAM cell 9 as compared with each single-port SRAM cell 6, whereby data can be easily written in the dual-port SRAM cell 9 when an inverted data signal output from the single-port SRAM cell 6 is written in the dual-port SRAM cell 9.

Second Embodiment

Figure 8:
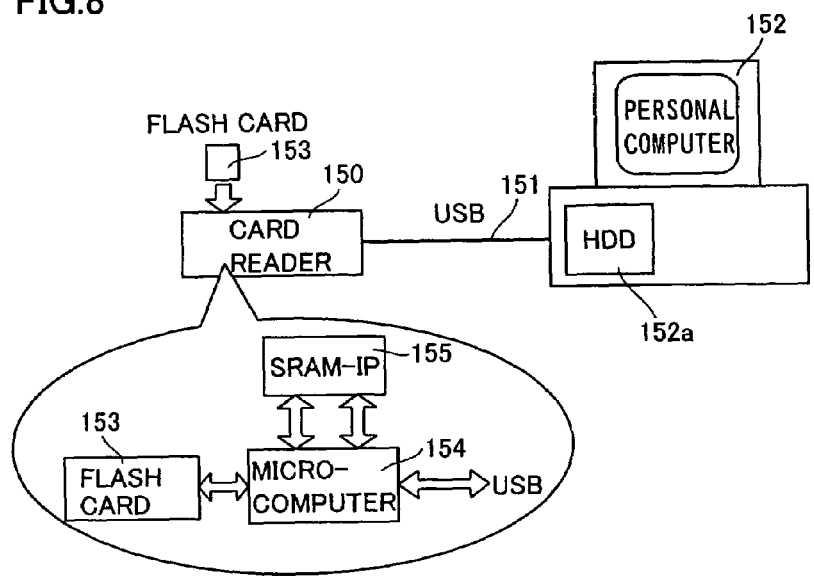
FIG. 8 is a model diagram showing the structure of a card reader including a semiconductor memory device (SRAM-IP) according to a second embodiment of the present invention.

As shown in FIG. 8, a card reader 150 including an SRAM-IP 155 according to a second embodiment of the present invention is connected to a personal computer 152 through a USB cable 151. This personal computer 152 comprises a hard disk 152a for storing data. The card reader 150 is so constituted that a flash card 153 serving as a data recording medium can be mounted thereon. The card reader 150 comprises a microcomputer 154 and the SRAM-IP (intellectual property) 155. The term "SRAM-IP" indicates a functional block of an SRAM built into a chip. This SRAM-IP 155 has a function of temporarily stocking data output from the hard disk 152a of the personal computer 152 and the flash card 153. The details of the SRAM-IP 155 are described later. The microcomputer 154 is provided in order to control data transfer between the hard disk 152a of the personal computer 152 and the flash card 153 and the SRAM-IP 155.

In operation, the card reader 150 including the SRAM-IP 155 according to the second embodiment outputs data recorded in the flash card 153 to the microcomputer 154 of the card reader 150, in order to transfer the data from the flash card 153 to the hard disk 152a of the personal computer 152. The microcomputer 154 accesses the SRAM-IP 155, thereby writing the data received therein in the SRAM-IP 155. The microcomputer 154 further accesses the SRAM-IP 155, in order to read the data written in the SRAM-IP 155. The data read from the SRAM-IP 155 is output to the personal computer 152 through the microcomputer 154 and the USB cable 151. The hard disk 152a of the personal computer 152 stores the data received in the personal computer 152.

In order to transfer data from the hard disk 152a of the personal computer 152 to the flash card 153, on the other hand, the personal computer 152 outputs the data recorded in the hard disk 152a to the microcomputer 154 of the card reader 150 through the USB cable 151. The microcomputer 154 accesses the SRAM-IP 155, thereby writing the data received therein in the SRAM-IP 155. The microcomputer 154 further accesses the SRAM-IP 155, thereby reading the data written therein. The microcomputer 154 outputs the data read from the SRAM-IP 155 to the flash card 153, which in turn records the data.

The structure of the semiconductor memory device (the SRAM-IP 155) according to the second embodiment of the present invention is now described with reference to FIGS. 9 to 12. A circuit diagram shown in FIG. 11 corresponds to that of a region A enclosed with broken lines in FIG. 9.

Figure 9:
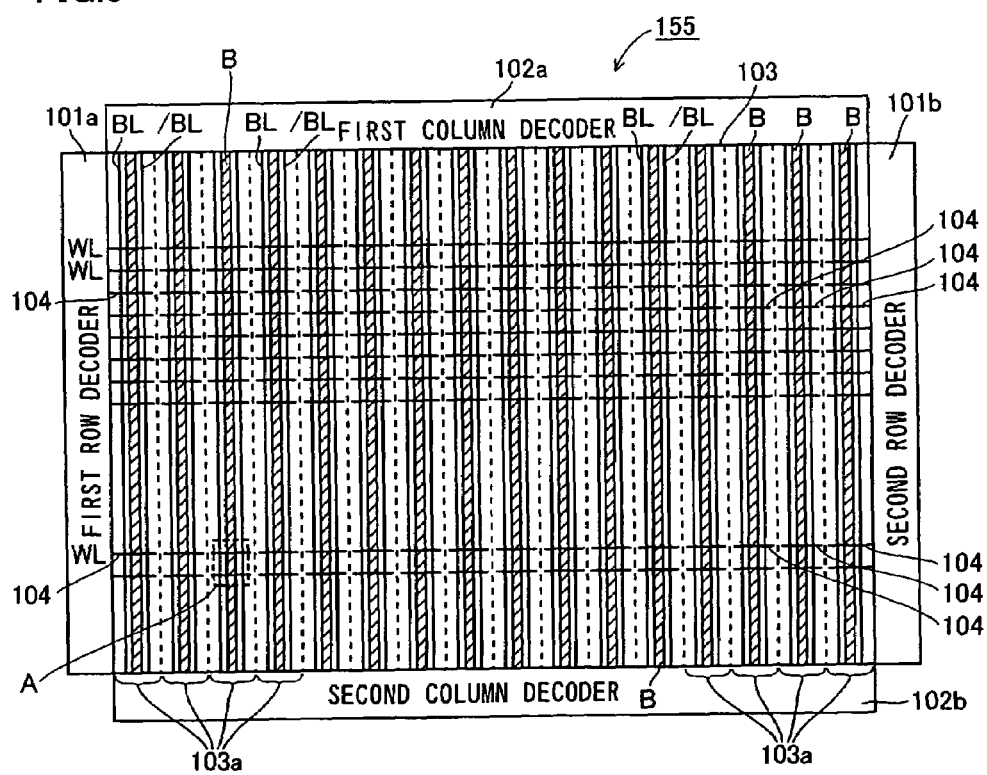
FIG. 9 is a plan view showing the structure of the semiconductor memory device (SRAM-IP) according to the second embodiment of the present invention.
Figure 10:
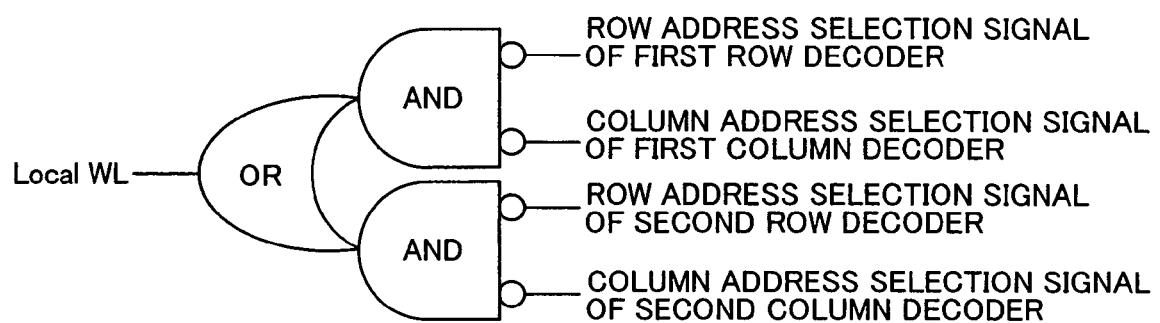
FIG. 10 illustrates a logic circuit of a sub decoder circuit in the semiconductor memory device (SRAM-IP) according to the second embodiment shown in FIG. 9.

As shown in FIG. 9, the SRAM-IP 155 according to the second embodiment comprises a pair of first and second row decoders 110a and 101b for selecting row addresses and a pair of first and second column decoders 102a and 102b for selecting column addresses. The SRAM-IP 155 further comprises a memory cell array region 103 formed with single-port SRAM cells etc. The memory cell array region 103 is divided into 16 blocks 103a. A plurality of pairs of bit lines BL and /BL and a plurality of word lines WL are arranged on the memory cell array region 103 to intersect with each other. While FIG. 9 shows only a pair of bit lines BL and /BL in relation to each block 103a of the memory cell array region 103, 32 pairs of bit lines BL and /BL are provided for each block 103a according to the second embodiment in practice. While FIG. 9 only partially shows the word lines WL, 128 word lines WL are provided according to the second embodiment in practice.

According to the second embodiment, each word line WL is divided into 16 local word lines 104 in correspondence to the 16 blocks 103a of the memory cell array region 103. Each of slant regions B shown in FIG. 9 is formed with sub decoder circuits 105a and 105b (see FIG. 11) constituting a logic circuit consisting of AND circuits and an OR circuit having inverted inputs shown in FIG. 10. The first one of the AND circuits constituting the logic circuit shown in FIG. 10 receives a row address selection signal and a column address selection signal from the first row decoder 101a (see FIG. 9) and the first column decoder 102a respectively, while the second AND circuit receives a row address selection signal and a column address selection signal from the second row decoder 101b and the second column decoder 102b respectively. Thus, the OR circuit outputs a signal obtained by ANDing either the row address selection signal and the column address selection signal from the first row decoder 101a (see FIG. 9) and the first column decoder 102a or the row address selection signal and the column address selection signal from the second row decoder 101b and the second column decoder 102b and activating the AND to each local word line 104 (see FIG. 9). More specifically, the OR circuit outputs a high-level signal when both of the row address selection signal and the column address selection signal from the first row decoder 101a (see FIG. 9) and the first column decoder 102a or both of the row address selection signal and the column address selection signal from the second row decoder 101b and the second column decoder 102b are at low levels.

Figure 11:
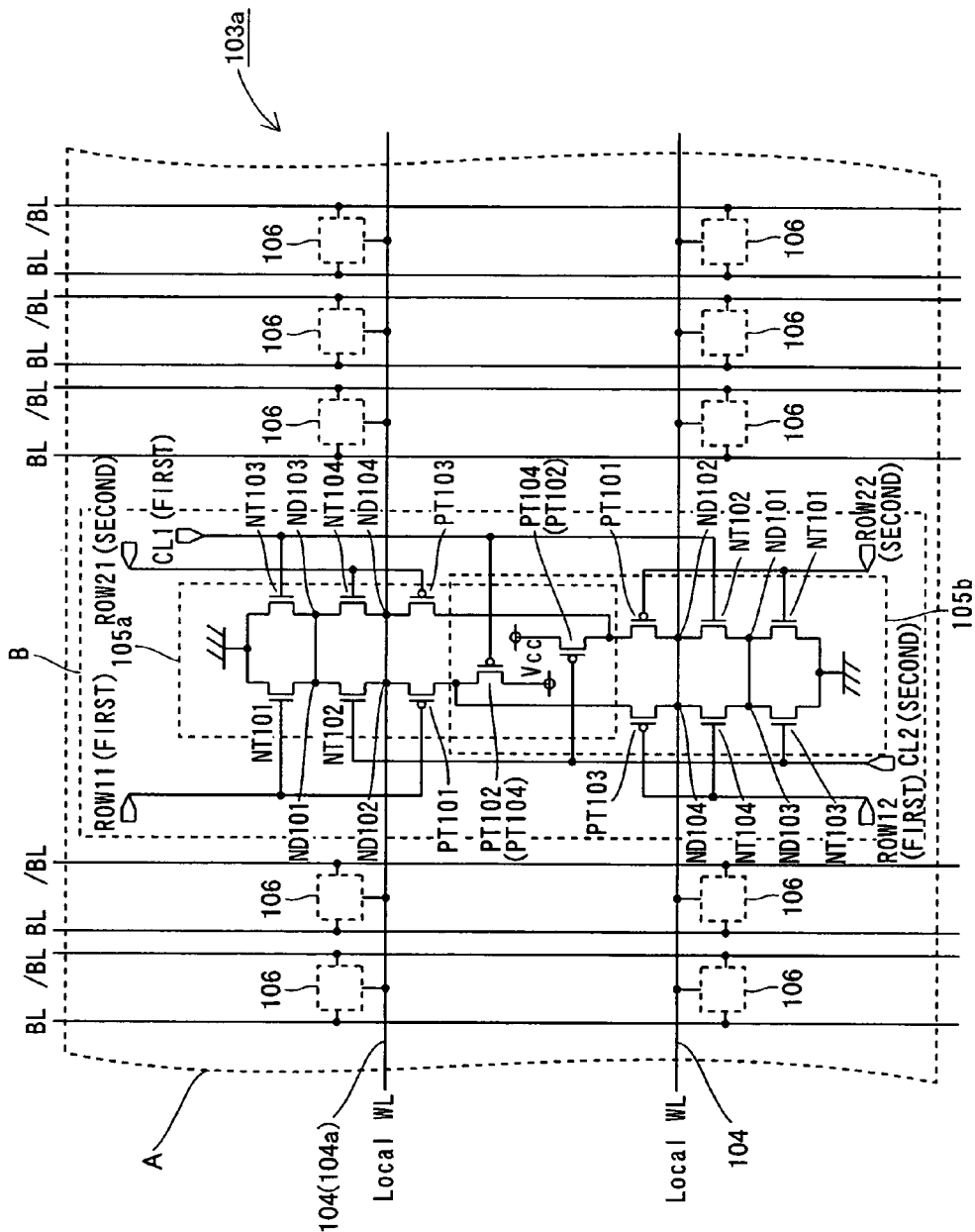
FIG. 11 illustrates a part of a circuit diagram of the semiconductor memory device (SRAM-IP) according to the second embodiment shown in FIG. 9.

As shown in FIG. 11, the slant region B of each block 103a of the memory cell array region 103 (see FIG. 9) in the SRAM-IP 155 is provided with a sub decoder circuit 105a (105b) every local word line 104. The sub decoder circuits 105a and 105b are provided along the extensional direction of the pairs of bit lines BL and /BL. A plurality of pairs of bit lines BL and /BL are arranged on both sides of the sub decoder circuits 105a and 105b. The plurality of local word lines 104 are provided to intersect with the pairs of bit lines BL and /BL. The sub decoder circuits 105a and 105b are connected to different local word lines 104 respectively. While FIG. 11 shows only five pairs of bit lines BL and /BL, 32 pairs of bit lines BL and /BL are provided for each block 103a of the memory cell array region 103 (see FIG. 9) according to the second embodiment in practice. While FIG. 11 shows only two local word lines 104, further, 128 local word lines 104 are provided for each block 103a according to the second embodiment in practice. While FIG. 11 shows only two sub decoder circuits 105a and 105b, 128 sub decoder circuits 105a (105b) are provided in correspondence to the 128 local word lines 104 respectively according to the second embodiment in practice.

As shown in FIG. 11, each sub decoder circuit 105a is constituted of four n-channel transistors NT101 to NT104 and four p-channel transistors PT101 to PT104. The n-channel transistor NT101 has a grounded source and a gate supplied with a row address selection signal ROW11 from the first row decoder 101a (see FIG. 9). The drain of the n-channel transistor NT101 is connected to the source of the n-channel transistor NT102. The gate of the n-channel transistor NT102 is supplied with a column address selection signal CL2 from the second column decoder 102b (see FIG. 9). The drain of the n-channel transistor NT102 is connected to the drain of the p-channel transistor PT101. A node ND102 between the drains of the n-channel transistor NT102 and the p-channel transistor PT101 is connected to the corresponding local word line 104. The gate of the p-channel transistor PT101 is supplied with the row address selection signal ROW11 from the first row decoder 101a (see FIG. 9). The source of the p-channel transistor PT101 is connected to the drain of the p-channel transistor PT102. The gate of the p-channel transistor PT102 is supplied with a column address selection signal CL1 from the first column decoder 102a (see FIG. 9). The source of the p-channel transistor PT102 is supplied with a positive voltage Vcc.

The n-channel transistor NT103 has a grounded source and a gate supplied with the column address selection signal CL1 from the first column decoder 102 (see FIG. 9). The drain of the n-channel transistor NT103 is connected to the source of the n-channel transistor NT104. A node ND103 between the drain of the n-channel transistor NT103 and the source of the n-channel transistor NT104 is connected to a node ND101 between the drain of the n-channel transistor NT101 and the source of the n-channel transistor NT102. The gate of the n-channel transistor NT104 is supplied with a row address selection signal ROW21 from the second row decoder 101b (see FIG. 9). The drain of the n-channel transistor NT104 is connected to the drain of the p-channel transistor PT103. A node ND104 between the drains of the n-channel transistor NT104 and the p-channel transistor PT103 is connected to the corresponding local word line 104. The gate of the p-channel transistor PT103 is supplied with the row address selection signal ROW21 from the second row decoder 101b (see FIG. 9). The source of the p-channel transistor PT103 is connected to the drain of the p-channel transistor PT104. The gate of the p-channel transistor PT104 is supplied with the column address selection signal CL2 from the second column decoder 102b (see FIG. 9). The source of the p-channel transistor PT104 is supplied with the positive voltage Vcc. The other sub decode circuit 105b is provided to be adjacent to the sub decoder circuit 105a along the extensional direction of the pairs of bit lines BL and /BL. This sub decoder circuit 105b is similar in structure to the aforementioned sub decoder circuit 105a.

According to the second embodiment, each pair of sub decoder circuits 105a and 105b share the p-channel transistors PT102 and PT104. More specifically, the p-channel transistor PT102 in the sub decoder circuit 105a corresponds to the p-channel transistor PT104 in the sub decoder circuit 105b. Further, the p-channel transistor PT104 in the sub decoder circuit 105a corresponds to the p-channel transistor PT102 in the sub decoder circuit 105b.

Figure 12:
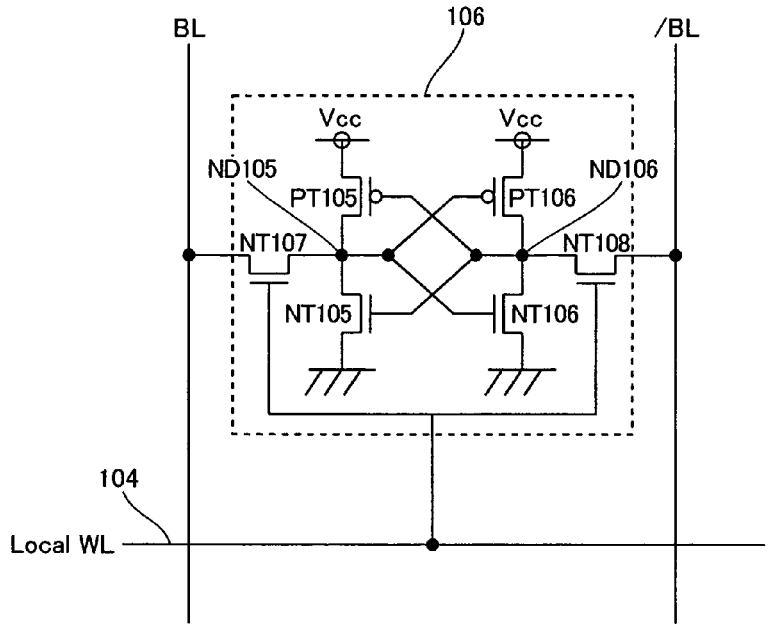
FIG. 12 is an enlarged circuit diagram showing a single-port SRAM cell part in the circuit diagram of the semiconductor memory device (SRAM-IP) according to the second embodiment shown in FIG. 11.

Each single-port SRAM cell 106 is arranged on the intersectional position between each local word line 104 and each pair of bit lines BL and /BL. The single-port SRAM cell 106 is connected to the corresponding pair of bit lines BL and /BL and the corresponding local word line 104. As shown in FIG. 12, each single-port SRAM cell 106 comprises six transistors in total, i.e., four n-channel transistors NT105 to NT108 and two p-channel transistors PT105 and PT106. The n-channel transistor NT105 has a grounded source and a drain connected to the drain of the p-channel transistor PT105. The source of the p-channel transistor PT105 is supplied with the positive voltage Vcc.

The n-channel transistor NT106 has a grounded source and a drain connected to the drain of the p-channel transistor PT106. The gates of the n-channel transistor NT105 and the p-channel transistor PT105 are connected to a node ND106 between the drains of the n-channel transistor NT106 and the p-channel transistor PT106. The source of the p-channel transistor PT106 is supplied with the positive voltage Vcc. The gates of the n-channel transistor NT106 and the p-channel transistor PT106 are connected to a node ND105 between the drains of the n-channel transistor NT105 and the p-channel transistor PT105.

Either the source or the drain of the n-channel transistor NT107 is connected to the node ND105, while the other one of the source and the drain is connected to the corresponding bit line BL. Either the source or the drain of the n-channel transistor NT108 is connected to the node ND106, while the other one of the source and the drain is connected to the corresponding inverted bit line /BL. The gates of the n-channel transistors NT107 and NT108 are connected to the corresponding local word line 104. The n-channel transistors NT107 and NT108 constitute the single port of the single-port SRAM cell 106.

Operations of the SRAM-IP 155 according to the second embodiment of the present invention are now described with reference to FIG. 13.

Figure 13:
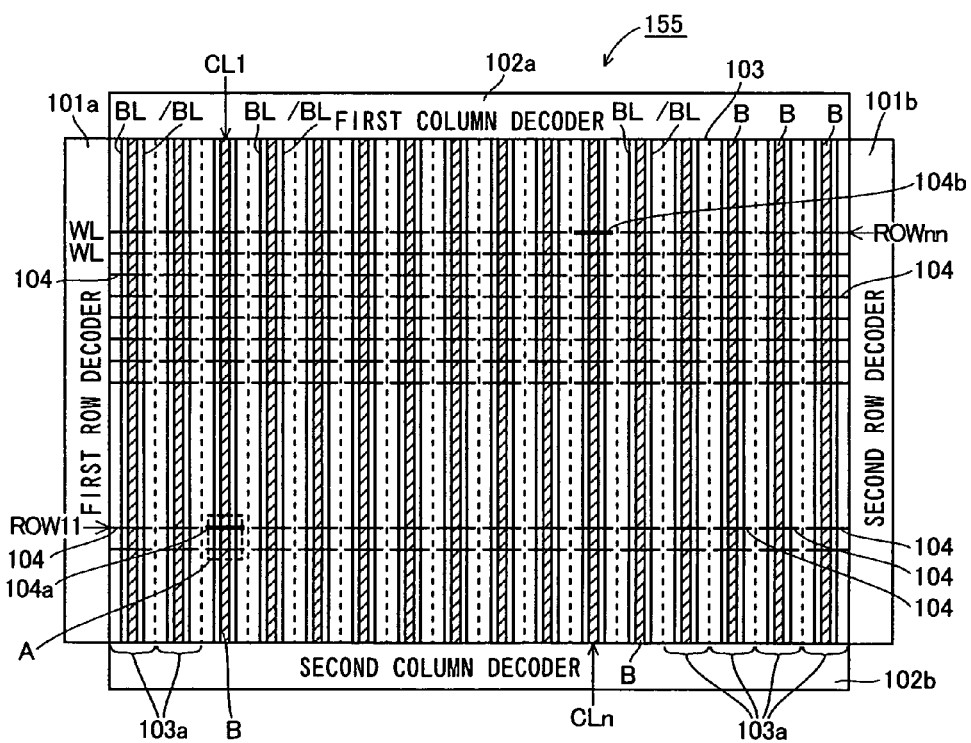
FIG. 13 is a plan view for illustrating operations of the semiconductor memory device (SRAM-IP) according to the second embodiment.

As shown in FIG. 13, the first row decoder 101a outputs the row address selection signal ROW11, while the first column decoder 102a outputs the column address selection signal CL1 in the DRAM-IP 155 according to the second embodiment. The potential of a local word line 104a of a first address goes high in response to the row address selection signal ROW11 from the first row decoder 101a and the column address selection signal CL1 from the first column decoder 102a. On the other hand, the second row decoder 101b outputs a row address selection signal ROWnn while the second column decoder 102b outputs a column address selection signal CLn. The potential of a local word line 104b of a second address goes high in response to the row address selection signal ROWnn from the second row decoder 101b and the column address selection signal CLn from the second column decoder 102b.

Thus, the SRAM-IPP 155 according to the second embodiment can set the two local word lines 104a and 104b corresponding to the first address selected through the first row decoder 101a and the first column decoder 102a and the second address selected through the second row decoder 101b and the second column decoder 102b respectively to high-level potentials at the same time. Consequently, the SRAM-IP 155 can access the single-port SRAM cells 106 connected with the local word lines 104a and 104b at the same time. However, the SRAM-IP 155 according to the second embodiment cannot access two single-port SRAM cells 106 connected to the same pair of bit lines BL and /BL at the same time but can access only two single-port SRAM cells 106 connected to different pairs of bit lines BL and /BL. In other words, the SRAM-IP 155 according to the second embodiment can access two single-port SRAM cells 106 having different column addresses at the same time.

Operations of each sub decoder circuit 105a and each single-port SRAM cell 106 performed when the potentials of the corresponding local word lines 104 selected through the first and second row decoders 101a and 101b and the first and second column decoders 102a and 102b go high are described with reference to FIGS. 11 to 13. In an initial state, the first and second row decoders 101a and 101b and the first and second column decoders 102a and 102b shown in FIG. 13 input high-level signals ROW11, ROW21, CL1 and CL2 in the sub decoder circuit 105a respectively, as shown in FIG. 11. Thus, the potentials of the gates of the n-channel transistors NT101 to NT104 and the p-channel transistors PT101 to PT104 go high, thereby turning the n-channel transistors NT101 to NT104 and the p-channel transistors PT101 to PT104 on and off respectively. Therefore, the nodes ND102 and ND104 are supplied with the ground potential GND through the n-channel transistors NT101 to NT104, whereby the potentials of the nodes ND102 and ND104 go low. Thus, the potentials of the local word line 104 are at low levels in the initial state. In this initial state, further, the n-channel transistors NT107 and NT108 of each single-port SRAM cell 106 (see FIG. 12) are in OFF states due to the low-level potentials of the local word lines 104. Thus, the SRAM-IP 155 can write/read no data in/from the single-port SRAM cells 106 through the corresponding pairs of bit lines BL and /BL, and hence the pairs of bit lines BL and /BL are inactive in the initial state.

Then, the row address selection signal ROW11 input in the sub decoder circuit 105a (see FIG. 11) from the first row decoder 101a (see FIG. 13) goes low. Thus, the potentials of the gates of the n-channel transistor NT101 and the p-channel transistor PT101 go low, thereby turning the n-channel transistor NT101 and the p-channel transistor PT101 off and on respectively. On the other hand, the column address selection signal CL1 input in the sub decoder circuit 105a (see FIG. 11) from the first column decoder 102a (see FIG. 13) goes low. Thus, the potentials of the gates of the n-channel transistor NT103 and the p-channel transistor PT102 go low, thereby turning the n-channel transistor NT103 and the p-channel transistor PT102 off and on respectively.

At this time, the n-channel transistors NT102 and NT104 are held in the ON states while the p-channel transistors PT103 and PT104 are held in the OFF states, whereby the node ND102 is supplied with the positive voltage Vcc through the p-channel transistors PT101 and PT102 so that the potential thereof goes high. Thus, the potentials of the corresponding local word lines 104 go high. When the potentials of the local word lines 104 go high, the potentials of the gates of the n-channel transistors NT107 and NT108 of the single-port SRAM cell 106 go high for turning on the n-channel transistors NT107 and NT108, as shown in FIG. 12. Thus, the SRAM-IP 155 can write/read data in/from the single-port SRAM cell 106 through the corresponding pairs of bit lines BL and /BL, thereby activating the pairs of bit lines BL and /BL.

According to the second embodiment, as hereinabove described, the SRAM-IP 155 is provided with the first and second row decoders 101a and 101b and the first and second column decoders 102a and 102b while each word line WL is divided into the plurality of local word lines 104 so that only the local word lines 104a and 104b corresponding to the address selected through the first row decoder 101a and the first column decoder 102a and the address selected through the second row decoder 101b and the second column decoder 102b respectively can be set to high-level potentials. Thus, the SRAM-IP 155 can set two different local word lines 104a and 104b corresponding to different addresses (column addresses) to high-level potentials respectively at the same time. Therefore, the SRAM-IP 155 can turn on the n-channel transistors NT107 and ND108 of the single-port SRAM cell 106 connected with the two different local word lines 104a and 104b simultaneously set to high-level potentials at the same time. Thus, the SRAM-IP can activate different pairs of bit lines BL and /BL connected to the single-port SRAM cell 106 at the same time thereby writing/reading data in/from the single-port SRAM cell 106 through the different pairs of bit lines BL and /BL at the same time. Therefore, the SRAM-IP 155 can be simultaneously accessed through two different systems. Consequently, access through the second system can be inhibited from entering the wait state during access through the first system, whereby the operating speed of the SRAM-IP 155 can be improved. Thus, access for writing data in the SRAM-IP 155 and access for reading data written in the SRAM-IP 155 can be simultaneously performed when transferring data between the hard disk 152a of the personal computer 152 and the flash card 153 in the card reader 150 shown in FIG. 8, whereby the operating speed of the card reader 150 can be improved.

According to the second embodiment, each word line WL is so divided into the plurality of local word lines 104 that only the local word lines 104a and 104b corresponding to the row address selected through the first and second row decoders 101a and 101b and the column address selected through the first and second column decoders 102a an 102b respectively can be set to high-level potentials, whereby it is possible to suppress activation of all pairs of bit lines BL and /BL following activation of a single word line WL dissimilarly to the conventional semiconductor memory device employing undivided word lines. Thus, the number of the pairs of bit lines BL and /BL activated following activation of the potential of the word line WL can be reduced, whereby power consumption of the SRAM-IP 155 can be reduced. Consequently, power consumption of the card reader 150 (see FIG. 8) including the SRAM-IP 155 according to the second embodiment can be reduced.

According to the second embodiment, the SRAM-IP 155 is so constituted of the single-port SRAM cells 106 that the area of the memory cell array region 103 formed with the single-port SRAM cells 106 can be reduced due to the small numbers of the pairs of bit lines BL and /BL and the transistors as compared with an SRAM-IP constituted of dual-port SRAM cells. Consequently, the SRAM-IP 155 can be further miniaturized as compared with the SRAM-IP constituted of dual-port SRAM cells.

According to the second embodiment, each pair of sub decoder circuits 105a and 105b adjacent to each other along the extensional direction of the pairs of bit lines BL and /BL so share the p-channel transistors PT2 and PT4 constituting the sub decoder circuit 105a (105b) that the number of the transistors constituting the sub decoder circuit 105a (105b) can be reduced, whereby the size of the sub decoder circuits 105a and 105b can be reduced.

Third Embodiment

The structure of a semiconductor memory device (SRAM-IP) 165 according to a third embodiment of the present invention is described with reference to FIG. 14. According to the third embodiment, the semiconductor memory device (SRAM-IP) 165 has access means for writing simultaneously received data of prescribed capacity in different addresses in different cycles every byte unit (8 bits), dissimilarly to the aforementioned second embodiment.

Figure 14:
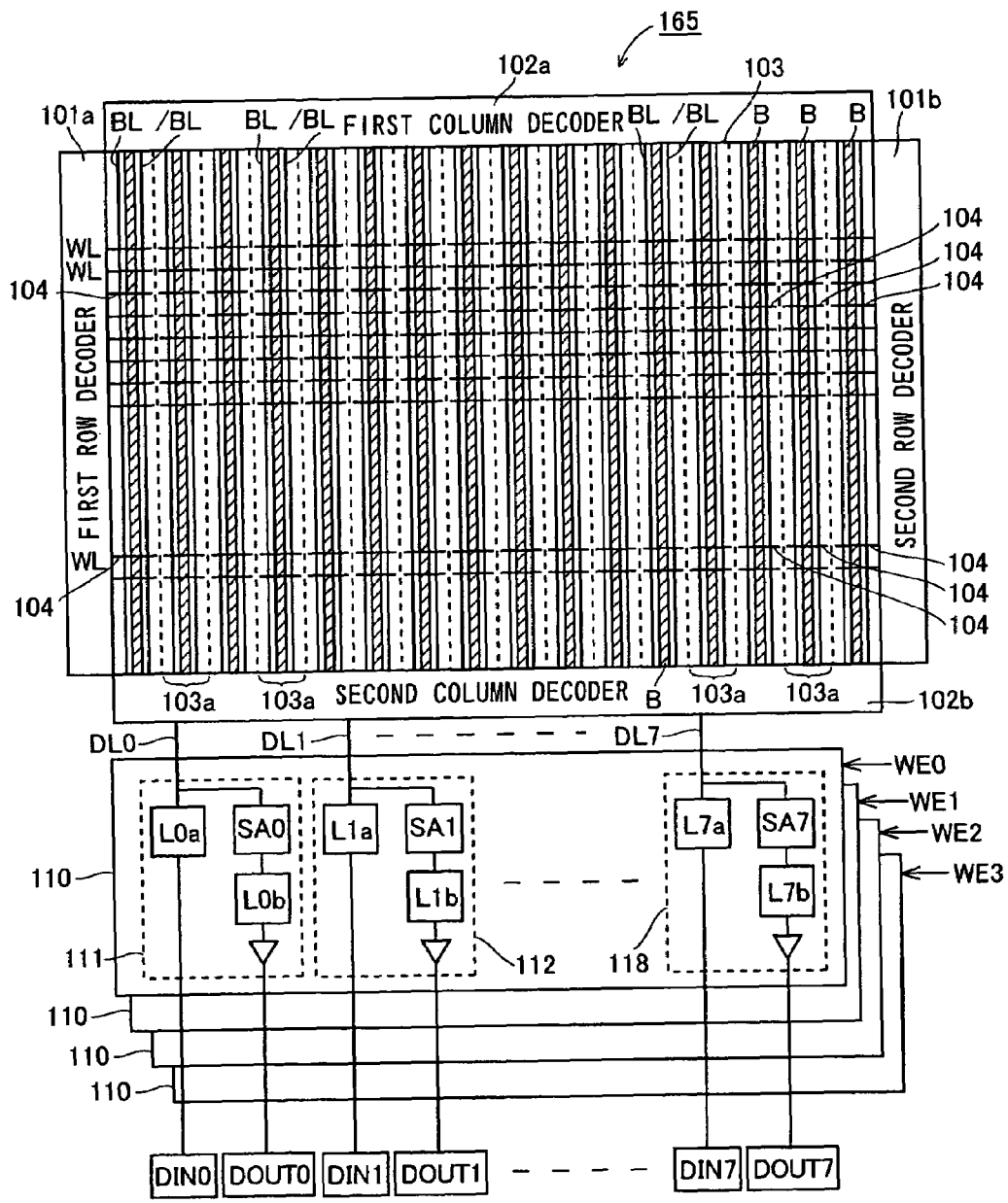
FIG. 14 is a plan view showing the structure of a semiconductor memory device (SRAM-IP) according to a third embodiment of the present invention.
Figure 15:
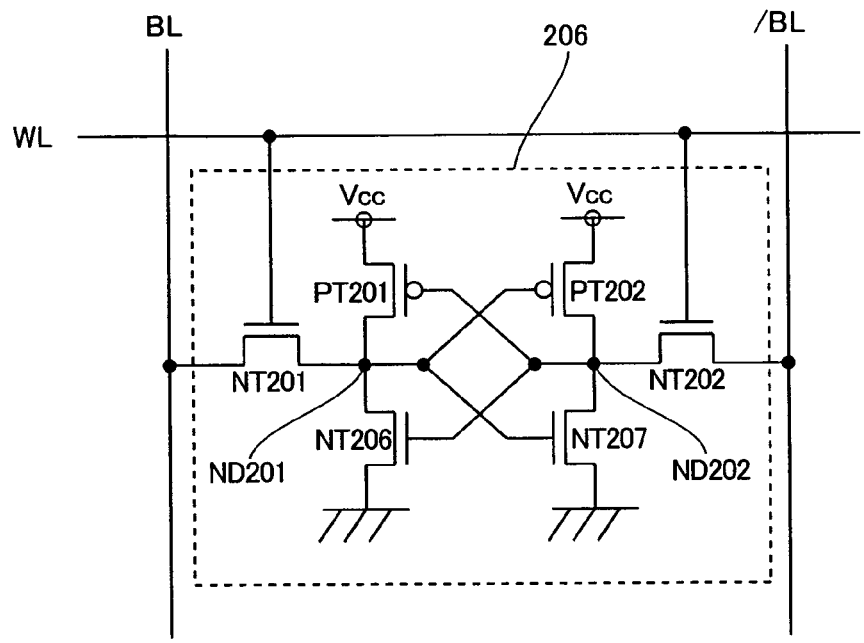
FIG. 15 is a circuit diagram showing an exemplary conventional single-port SRAM cell.
Figure 16:
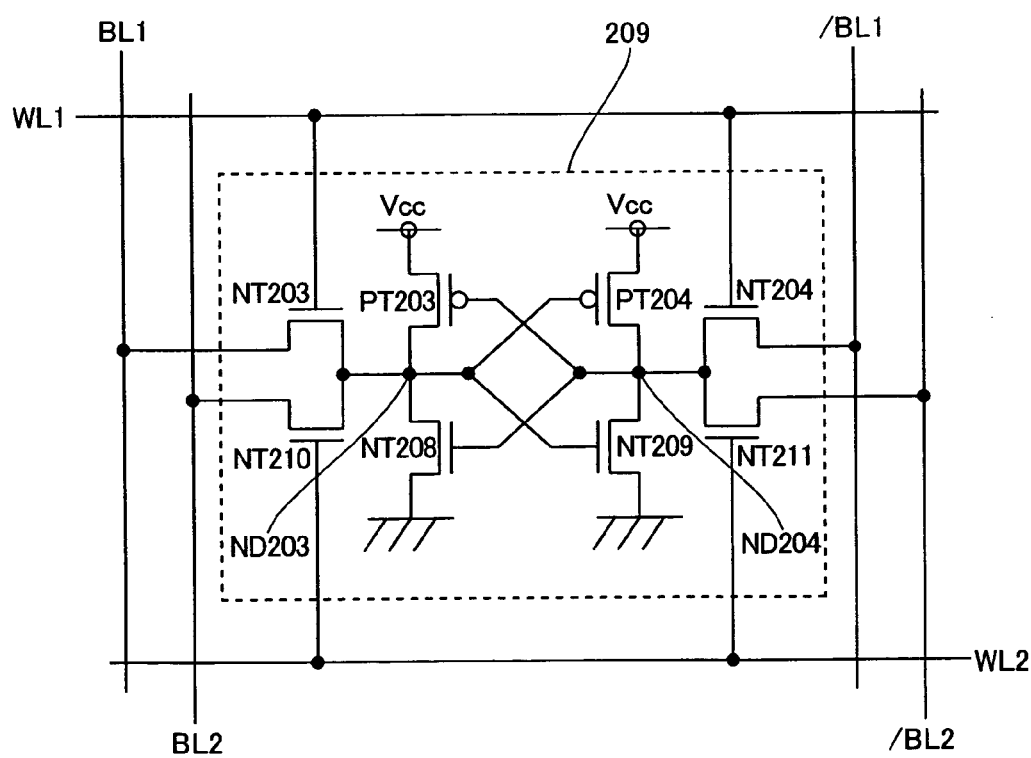
FIG. 16 is a circuit diagram showing a conventional duel-port SRAM cell.

In the structure of the SRAM-IP 165 according to the third embodiment, four (four-byte) input/output circuit parts 110 for inputting and outputting data are connected to a second column decoder 102b of the SRAM-IP 165, as shown in FIG. 14. FIG. 14 shows only the structure of one (one-byte) input/output circuit part 110, for simplifying the illustration. This input/output circuit part 110 is an example of the "access means" or the "access circuit part" in the present invention. Each input/output circuit part 110 includes eight circuit parts 111 to 118. The eight circuit parts 111 to 118 comprise latch circuits L0a to L7a and L0b to L7b and sense amplifiers SA0 to SA7 respectively. The latch circuits L0a to L7a are examples of the "write latch circuit part" in the present invention, and the latch circuits L0b to L7b are examples of the "read latch circuit part" in the present invention. The latch circuits L0a to L7a are connected to input circuits DIN0 to DIN7 respectively, and connected to the second column decoder 102b through data lines DL0 to DL7 respectively. The sense amplifiers SA0 to SA7 are connected to the second column decoder 102b through the data lines DL0 to DL7 respectively, and connected to output circuits DOUT0 to DOUT7 through the latch circuits L0b to L7b respectively. Write enable signals WE0 to WE3 are supplied to the input/output circuit parts 110 respectively. The write enable signals WE0 to WE3 are examples of the "write signal" in the present invention. The write enable signals WE0 to WE3 supplied to the input/output circuit parts 110 and input latch signals are input in the latch circuits L0a to L7a respectively. The latch circuits L0a to L7a are provided for temporarily holding data input in the circuit parts 111 to 118 of the input/circuit parts 110. The respective latch circuits L0a to L7a are so constituted as to output the held data to the data lines DL0 to DL7 when receiving low-level write enable signals WE0 to WE3, while not outputting the held data to the data lines DL0 to DL7 when receiving high-level write enable signals WE0 to WE3. The sense amplifiers SA0 to SA7 have functions of amplifying output signals received from single-port SRAM cells (not shown). The SRAM-IP 165 controls the latch circuits L0*b* to L7*b* every byte unit, similarly to write control signals and the input latch signals. Thus, the SRAM-IP 165 can continuously output read data to a cycle subsequent to that of reading the data and a further subsequent cycle. The remaining structure of the SRAM-IP 165 is similar to that of the SRAM-IP 155 according to the aforementioned second embodiment.

When data of prescribed capacity are simultaneously input in the SRAM-IP 165 according to the third embodiment, the data of the prescribed capacity are divided into four data D0 to D3 every byte unit. The four data D0 to D3 divided every byte unit are input in the circuit parts 111 to 118 of the four input/output circuits 110 respectively. More specifically, the four 8-bit data D0 to D3 are input in the latch circuits L0*a* to L7*a* of the circuit parts 111 to 118 through the first- to four-byte input circuits DIN0 to DIN7 respectively. At this time, all latch circuits L0*a* to L7*a* of the four input/output circuit parts 110 receive high-level write enable signals WE0 to WE3. Thus, the latch circuits L0*a* to L7*a* of the circuit parts 111 to 118 of the four input/output circuit parts 110 temporarily hold the data D0 to D3.

According to the third embodiment, the SRAM-IP 165 can write the data D0 to D3 obtained by dividing the simultaneously received data of the prescribed capacity every byte unit in different addresses in different cycles respectively by controlling the write enable signals WE0 to WE3. More specifically, the SRAM-IP 165 activates a single-port SRAM cell (not shown) of a first address through a first row decoder 101*a* and a first column decoder 102*a*, in order to write only the data D0 included in the data D0 to D3 in the first address in a first cycle. In this state, the SRAM-IP 165 inputs a low-level write enable signal WE0 in the first-byte input/output circuit part 110 holding the data D0 while inputting high-level write enable signals WE1 to WE3 in the remaining second- to fourth-byte input/output circuit parts 110 respectively. Thus, the latch circuits L0*a* to L7*a* of the first-byte input/output circuit part 110 receiving the low-level write enable signal WE0 output 8-bit data D0 to the corresponding data lines DL0 to DL7 respectively, while the latch circuits L0*a* to L7*a* of the second- to fourth-byte input/output circuits 110 receiving the high-level write enable signals WE1 to WE3 respectively output no data D1 to D3. Thus, the SRAM-IP 165 writes the 8-bit data D0 output to the first-byte data lines DL0 to DL7 in the activated single-port SRAM cell (not shown) of the first address through the second column decoder 102*b* and a corresponding pair of bit lines BL and /BL.

In a subsequent second cycle, the SRAM-IP 165 activates a single-port SRAM cell (not shown) of a second address different from the first address and inputs a low-level write enable signal WE1 in the latch circuits L0*a* to L7*a* of the second-byte input/output circuit part 110 holding the data D1. Thus, the latch circuits L0*a* to L7*a* of the second-byte input/output circuit part 110 holding the 8-bit data D1, not output in the first cycle, to the corresponding data lines DL0 to DL7. Thus, the SRAM-IP 165 writes the 8-bit data D1 output to the data lines DL0 to DL7 in the activated single-port SRAM cell (not shown) of the second address through the second column decoder 102*b* and the corresponding pair of bit lines BL and /BL. In a subsequent third cycle, the SRAM-IP 165 activates a single-port SRAM cell (not shown) of a third address different from the second address and inputs a low-level write enable signal WE2 in the latch circuits L0*a* to L7*a* of the third-byte input/output circuit part 110 holding the 8-bit data D2, thereby writing the data D2 in the single-port SRAM cell (not shown) of the third address. In a subsequent fourth cycle, the SRAM-IP 165 activates a single-port SRAM cell (not shown) of a fourth address different from the third address and inputs a low-level write enable signal WE3 in the latch circuits L0*a* to L7*a* of the fourth-byte input/output circuit part 110 holding the 8-bit data D3, thereby writing the data 8-bit D3 in the single-port SRAM cell (not shown) of the fourth address.

Thus, the SRAM-IP 165 according to the third embodiment, activating the single-port SRAM cells of different addresses every cycle while successively inputting low-level write enable signals WE0 to WE3 in the latch circuits L0*a* to L7*a* of the first- to fourth-byte input/output circuit parts 110 respectively, can write data of prescribed capacity simultaneously input therein in different addresses in different cycles every byte unit.

Although the present invention has been described and illustrated in detail, it is clearly understood that the same is by way of illustration and example only and is not to be taken by way of limitation, the spirit and scope of the present invention being limited only by the terms of the appended claims.

For example, while the second ports of the dual-port SRAM cells 9 of the auxiliary memories 4 are dedicated to data reading from the dual-port SRAM cells 9 in the aforementioned first embodiment, the present invention is not restricted to this but the bit lines BL and /BL may alternatively be connected to the second ports of the dual-port SRAM cells 9 so that data can be read and written through the second ports.

While the auxiliary memories 4 are provided on the ends of the memory cell arrays 7 closer to the auxiliary column decoder 2*a* in the aforementioned first embodiment, the present invention is not restricted to this but the auxiliary memories 4 may alternatively be arranged on prescribed positions other than the ends of the memory cell arrays 7.

While the data are read from the sub port 2*b* in the cycle of writing data from the main port 1*b* in the aforementioned first embodiment, the present invention is not restricted to this but data may alternatively be read from the sub port 2*b* in a cycle of reading data from the main port 1*b*.

While the address signals A0, A1 and A2 are supplied to the word lines WL through the single NAND circuit 15 and the single inverter circuit 16 and the address signals A0, /A0, A1, /A1, A2 and /A2 are supplied to the auxiliary word line SWL as the transfer signal TF through the OR circuits 17*a* to 17*c*, the single AND circuit 18 and the two inverter circuits 19*a* and 19*b* so that the auxiliary word line SWL goes high after the word lines WL go high in the aforementioned first embodiment, the present invention is not restricted to this but the auxiliary word line SWL may alternatively be set high after the word lines WL are set high through another means.

While the semiconductor memory device according to the present invention is applied to the SRAM-IP 155 serving as the functional block built into the chip in the aforementioned second embodiment, the present invention is not restricted to this but may alternatively be applied to an ordinary SRAM chip.

While the card reader 150 including the semiconductor memory device (SRAM-IP) 155 according to the present invention is described with reference to the aforementioned second embodiment, the present invention is not restricted to this but the semiconductor memory device (SRAM-IP) according to the present invention may alternatively be directly inserted into a USB port of a personal computer to be included in the so-called USB memory capable of writing and reading data in and from the personal computer.

While the sub decoder circuits 105*a* and 105*b* share the p-channel transistors PT2 and PT4 in the aforementioned second embodiment, the present invention is not restricted to this but pairs of sub decoder circuits adjacent to each other along the extensional direction of bit lines may not partially share transistors constituting the sub decoder circuits.

While the data D0 to D3 obtained by dividing the simultaneously received data of the prescribed capacity every byte unit are written in the single-port SRAM cells of different addresses in different cycles respectively in the aforementioned third embodiment, the present invention is not restricted to this but data received in the semiconductor memory device (SRAM-IP) 165 may alternatively be written in the single-port SRAM cells at the same time. More specifically, the SRAM-IP 165 inputs high-level write enable signals WE0 to WE3 in the latch circuits L0*a* to L7*a* of the four input/output circuit parts 110 respectively. In this state, the SRAM-IP 165 inputs the first-byte data D0 in the latch circuits L0*a* to L7*a* of the first-byte input/output circuit part 110 in the first cycle. At this time, the latch circuits L0*a* to L7*a* of the first-byte input/output circuit part 110, receiving the high-level write enable signal WE0, output no data D0 to the corresponding data lines DL0 to DL7 in the first cycle. In the subsequent second cycle, the SRAM-IP 165 inputs the data D1 in the latch circuits L0*a* to L7*a* of the second-byte input/output circuit part 110. At this time, the latch circuits L0*a* to L7*a* of the second-byte input/output circuit part 110, receiving the high-level write enable signal WE1, output no data D1 to the corresponding data lines DL0 to DL7 in the second cycle.

In the subsequent third cycle, the SRAM-IP 165 inputs the data D2 in the latch circuits L0*a* to L7*a* of the third-byte input/output circuit part 110. At this time, the latch circuits L0*a* to L7*a* of the third-byte input/output circuit part 110, receiving the high-level write enable signal WE2, output no data D2 to the corresponding data lines DL0 to DL7 in the third cycle. In the subsequent fourth cycle, the SRAM-IP 165 inputs the data D3 in the latch circuits L0*a* to L7*a* of the fourth-byte input/output circuit part 110. At this time, the latch circuits L0*a* to L7*a* of the fourth-byte input/output circuit part 110, receiving the high-level write enable signal WE3, output no data D3 to the corresponding data lines DL0 to DL7 in the fourth cycle. In a subsequent fifth cycle, the SRAM-IP 165 inputs low-level write enable signals WE0 to WE3 in the latch circuits L0*a* to L7*a* of the first- to fourth-byte input/output circuit parts 110 respectively. Thus, the latch circuits L0*a* to L7*a* of the first- to fourth-byte input/output circuit parts 110 simultaneously output the data D0 to D3 held therein to the corresponding data lines DL0 to DL7 respectively. The SRAM-IP 165 writes the data D0 to D3 simultaneously output to the corresponding data lines DL0 to DL7 in a prescribed activated single-port SRAM cell through the second column decoder 102*b* and the corresponding pair of bit lines BL and /BL. Thus, the SRAM-IP 165 can write the data received therein in different cycles in the single-port SRAM cell at the same time.

While each of the four input/output circuit parts 110 is provided with the eight circuit parts 111 to 118 in order to divide the data of the prescribed capacity received in the SRAM-IP 165 every byte unit and write the same in different addresses in different cycles in the aforementioned third embodiment, the present invention is not restricted to this but each of the four input/output circuit parts 110 may alternatively be provided with an arbitrary number, other than eight, of circuit parts. Thus, the SRAM-IP 165 may alternatively divide the data of the prescribed capacity externally received therein every arbitrary bit unit other than 8 bits for writing the same in different addresses in different cycles.

While the SRAM-IP 165 according to the aforementioned third embodiment individually writes the data in different addresses in different cycles from each of the four (four-byte) input/output circuit parts 110, the present invention is not restricted to this but the SRAM-IP 165 may alternatively write data in the single-port SRAM cell from the second- and third-byte input/output circuit parts 110, for example, among the four input/output circuit parts 110 while simultaneously reading data from another single-port SRAM cell through the first- and fourth-byte input/output circuit parts 110. In the aforementioned case, an arbitrary number of circuit parts other than eight circuit parts may alternatively be provided on each input/output circuit part for individually writing/reading data every arbitrary bit other than 8 bits.

What is claimed is:

1. A semiconductor memory device comprising:
    a plurality of word lines and a plurality of bit lines arranged to intersect with each other;
    a memory cell array including a plurality of single-port SRAM cells, each having a single port, connected to said word lines and said bit lines;
    an auxiliary word line arranged on a prescribed position of said memory cell array; and
    an auxiliary memory, arranged along said auxiliary word line, including a column of dual-port SRAM cells having at least first ports connected to said bit lines.

2. The semiconductor memory device according to claim 1, provided with only single said auxiliary word line.

3. The semiconductor memory device according to claim 1, wherein
    said dual-port SRAM cells further include second ports not connected to said bit lines, and
    said second ports are dedicated to data reading from said dual-port SRAM cells.

4. The semiconductor memory device according to claim 3, further comprising an auxiliary column decoder supplying a column address selection signal to said dual-port SRAM cells, wherein
    said second ports of said dual-port SRAM cells output signals by ANDing said column address selection signal supplied from said auxiliary column decoder and data signals output from said dual-port SRAM cells.

5. The semiconductor memory device according to claim 1, wherein
    each said dual-port SRAM cell includes two inverter circuits,
    said two inverter circuits are connected to a ground potential through an n-channel transistor, and
    a first transfer signal and a second transfer signal obtained by inverting said first transfer signal are input in said auxiliary word line and the gate of said n-channel transistor respectively.

6. The semiconductor memory device according to claim 1, activating said auxiliary word line connected with said dual-port SRAM cells after activating said word lines connected with said single-port SRAM cells when transferring data from said single-port SRAM cells to said dual-port SRAM cells.

7. The semiconductor memory device according to claim 6, inputting a row address selection signal and a first transfer signal in said word lines and said auxiliary word line respectively,
    for inputting said row address selection signal for activating said word lines in said word lines and thereafter inputting said first transfer signal for activating said auxiliary word line in said auxiliary word line.

8. The semiconductor memory device according to claim 7, further comprising:
- a row decoder supplying said row address selection signal to said word lines, and
- a transfer signal generation circuit supplying said first transfer signal to said auxiliary word line, wherein
- said row decoder includes a prescribed number of inverter circuits,
- said transfer signal generation circuit includes inverter circuits in a number larger than said prescribed number,
- said row address selection signal is input in said word lines through said prescribed number of inverter circuits of said row decoder, and
- said first transfer signal is input in said auxiliary word line through said inverter circuits of said transfer signal generation circuit in said number larger than said prescribed number.

9. The semiconductor memory device according to claim 1, outputting data of a column of said single-port SRAM cells connected to selected prescribed said word line to said bit lines while transferring said data to said column of dual-port SRAM cells at the same time when transferring said data from said single-port SRAM cells to said dual-port SRAM cells.

10. The semiconductor memory device according to claim 1, wherein
- the drivability ratio of a p-channel transistor to an n-channel transistor in each said dual-port SRAM cell is larger than the drivability ratio of a p-channel transistor to an n-channel transistor in each said single-port SRAM cell.

11. The semiconductor memory device according to claim 10, wherein
- the drivability ratios of said p-channel transistors to said n-channel transistors in each said dual-port SRAM cell and each said single-port SRAM cell are controlled through the ratios of the gate widths of said p-channel transistors to the gate widths of said n-channel transistors in each said dual-port SRAM cell and each said single-port SRAM cell or the ratios of the gate lengths of said p-channel transistors to the gate lengths of said n-channel transistors.

12. A semiconductor memory device comprising:
- a plurality of bit lines and a plurality of word lines arranged to intersect with each other, each said word line is divided into a plurality of local word lines;
- a single-port SRAM cell, connected to said bit lines and said word lines, having a single port for inputting/outputting data;
- a first row decoder and a second row decoder connected to said word lines for selecting a row address;
- a first column decoder and a second column decoder connected to said bit lines for selecting a column address; and
- a sub decoder circuit for supplying a signal, obtained by ANDing at least either two address selection signals from said first row decoder and said first column decoder or two address selection signals from said second row decoder and said second column decoder, to said local word lines.

13. The semiconductor memory device according to claim 12, activating said local word lines in response to at least either address selection signals from said first row decoder and said first column decoder or address selection signals from said second row decoder and said second column decoder.

14. The semiconductor memory device according to claim 12, wherein
- said word lines are so constituted that two said local word lines corresponding to a first address selected through said first row decoder and said first column decoder and a second address selected through said second row decoder and said second column decoder respectively are activated at the same time.

15. The semiconductor memory device according to claim 12, wherein
- said sub decoder circuit is provided every said local word line, and
- two said sub decoder circuits adjacent to each other along an extensional direction of said bit lines partially share transistors constituting said sub decoder circuits.

16. The semiconductor memory device according to claim 12, further comprising access means for writing substantially simultaneously received data of prescribed capacity in different addresses in different cycles every prescribed bit unit.

17. The semiconductor memory device according to claim 16, wherein
- said access means includes a plurality of access circuit parts provided every said prescribed bit unit, and
- said plurality of access circuit parts write said data of said prescribed bit unit in different said addresses in different said cycles respectively.

18. The semiconductor memory device according to claim 17, wherein
- said plurality of access circuit parts include write latch circuit parts receiving write signals and holding said data of said prescribed bit unit respectively, and
- said write latch circuit parts write said data of said prescribed bit unit when receiving first said write signals while not writing said data of said prescribed bit unit when receiving second said write signals.

19. The semiconductor memory device according to claim 16, wherein
- said access means individually writes or reads data every said prescribed bit unit.

20. The semiconductor memory device according to claim 19, wherein
- said access means includes a plurality of access circuit parts provided every said prescribed bit unit,
- said plurality of access circuit parts include read latch circuits holding data to be read every said prescribed bit unit respectively, and
- a plurality of said read latch circuit parts are individually controlled every said prescribed bit unit.

21. The semiconductor memory device according to claim 12, further comprising access means for writing data of a prescribed bit unit received in different cycles substantially at the same time.

22. The semiconductor memory device according to claim 21, wherein
- said access means includes a plurality of access circuit parts provided every said prescribed bit unit, and
- said plurality of access circuit parts hold said data of said prescribed bit unit received in said different cycles and thereafter write said data substantially at the same time.

23. The semiconductor memory device according to claim 22, wherein
- said plurality of access circuit parts include write latch circuit parts receiving write signals and holding said data of said prescribed bit unit respectively, and
- said write latch circuit parts write said data of said prescribed bit unit when receiving first said write signals while not writing said data of said prescribed bit unit when receiving second said write signals.

* * * * *